United States Patent
Ge et al.

(10) Patent No.: US 10,419,263 B2
(45) Date of Patent: Sep. 17, 2019

(54) TRANSMISSION SYSTEM AND METHOD

(71) Applicant: FUJITSU LIMITED, Kawasaki-shi, Kanagawa (JP)

(72) Inventors: Yi Ge, Bunkyo (JP); Takeshi Hoshida, Kawasaki (JP); Hisao Nakashima, Kawasaki (JP); Yuichi Akiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/029,274

(22) Filed: Jul. 6, 2018

(65) Prior Publication Data
US 2019/0020531 A1 Jan. 17, 2019

(30) Foreign Application Priority Data

Jul. 14, 2017 (JP) ................. 2017-138364

(51) Int. Cl.
*H04K 1/02* (2006.01)
*H04L 27/36* (2006.01)
(Continued)

(52) U.S. Cl.
CPC ............ *H04L 27/364* (2013.01); *H03C 3/40* (2013.01); *H03C 5/00* (2013.01); *H03F 1/00* (2013.01);
(Continued)

(58) Field of Classification Search
CPC ... H04L 27/3364; H04L 1/0042; H04L 25/49; H03C 3/40; H03F 1/00; H03F 2200/336; H04B 1/0475
(Continued)

(56) References Cited

U.S. PATENT DOCUMENTS

2009/0162059 A1* 6/2009 Nakamoto ......... H04B 10/2569
398/48
2010/0189445 A1* 7/2010 Nakashima ............ H04B 10/60
398/152
(Continued)

FOREIGN PATENT DOCUMENTS

JP 2010-178090 8/2010
JP 2011-232553 11/2011
(Continued)

OTHER PUBLICATIONS

Z. Tao et al., "Simple, Robust, and Wide-Range Frequency Offset Monitor for Automatic Frequency Control in Digital Coherent Receivers", ECOC 2007, pp. 1-2 (2 pages).

*Primary Examiner* — Helene E Tayong
(74) *Attorney, Agent, or Firm* — Fujitsu Patent Center

(57) ABSTRACT

A transmission system includes a first transponder including a first I/Q modulator, and a second transponder including a second I/Q modulator, and configured to communicate with the first transponder using a frequency modulation scheme, wherein the first transponder is configured to set a first phase rotation mode in a first state for first light signal output from the first I/Q modulator, and transmit, to the second transponder, a first command to specify a second phase rotation mode for second light signal output from the second I/Q modulator, and the second transponder is configured to set, in response to the first command, the second phase rotation mode in a state specified by the first command.

16 Claims, 24 Drawing Sheets

(51) Int. Cl.
  *H03C 3/40*    (2006.01)
  *H04L 1/00*    (2006.01)
  *H03F 1/00*    (2006.01)
  *H04L 25/49*   (2006.01)
  *H03F 3/24*    (2006.01)
  *H03C 5/00*    (2006.01)
  *H04B 1/04*    (2006.01)

(52) U.S. Cl.
  CPC ............ *H03F 3/24* (2013.01); *H04L 1/0042* (2013.01); *H04L 25/49* (2013.01); *H03F 2200/336* (2013.01); *H04B 1/0475* (2013.01); *H04L 1/0047* (2013.01)

(58) Field of Classification Search
  USPC ........................................................ 375/296
  See application file for complete search history.

(56) References Cited

U.S. PATENT DOCUMENTS

| | | | |
|---|---|---|---|
| 2012/0141130 A1 | 6/2012 | Nakashima et al. | |
| 2013/0202315 A1* | 8/2013 | Akiyama | H04B 10/50 398/182 |
| 2013/0209093 A1 | 8/2013 | Tanimura et al. | |
| 2016/0036533 A1 | 2/2016 | Nakashima et al. | |

FOREIGN PATENT DOCUMENTS

| | | |
|---|---|---|
| JP | 2012-120010 | 6/2012 |
| JP | 2013-165407 | 8/2013 |
| JP | 2015-002519 | 1/2015 |
| JP | 2016-034078 | 3/2016 |

\* cited by examiner

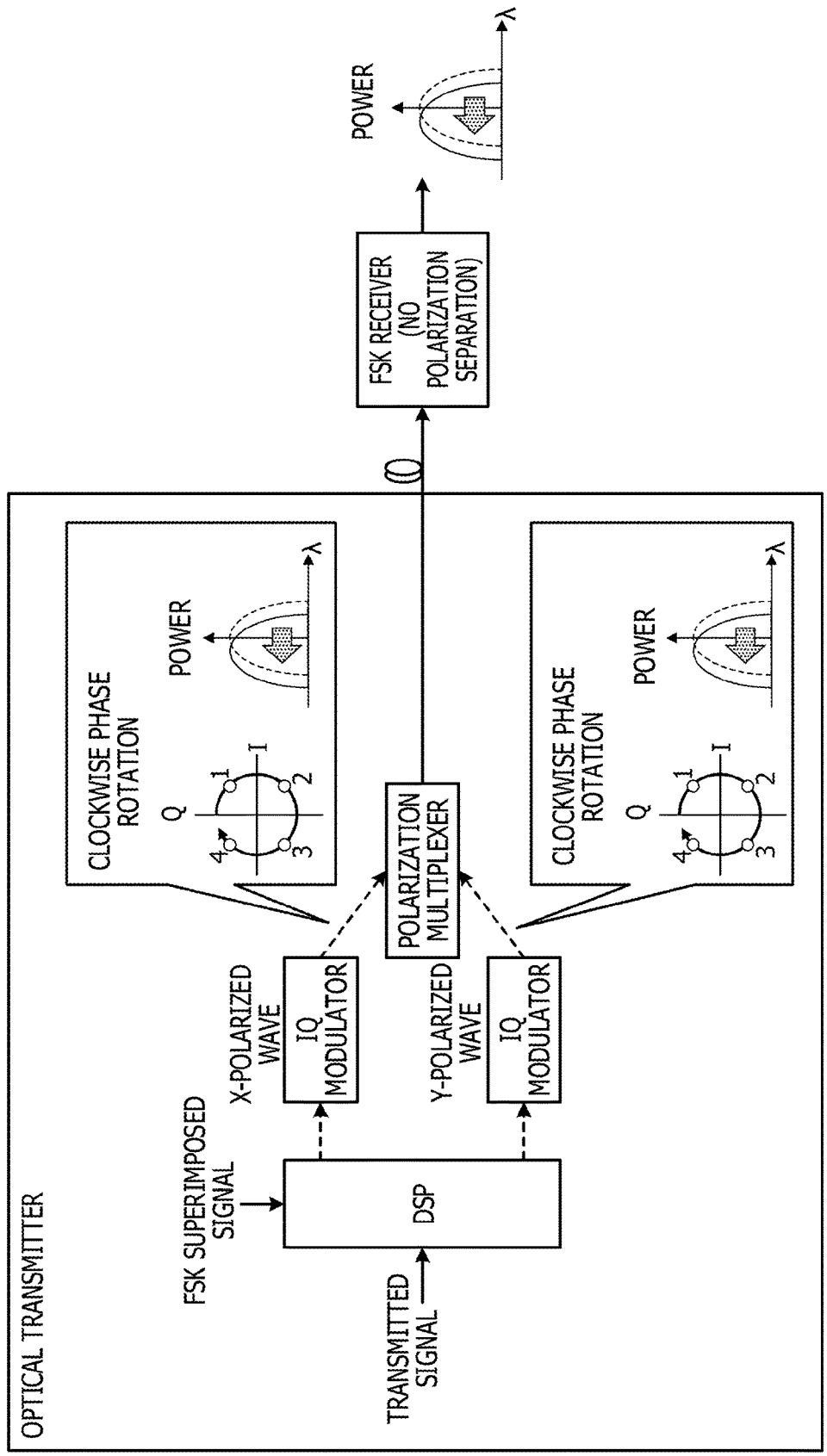

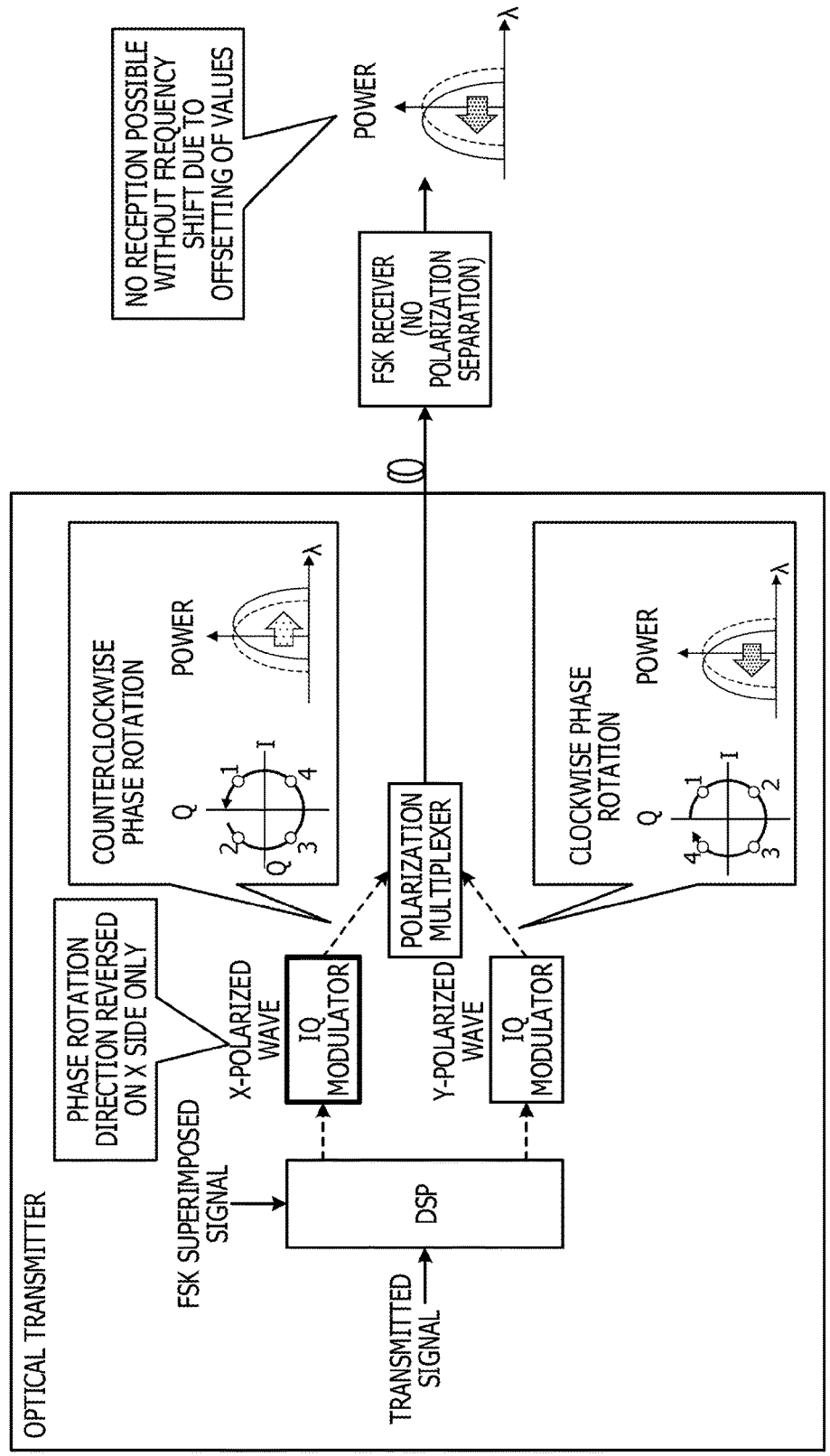

FIG. 11A

A TO B
CORRECT ANSWER →SWAP FOR Y ONLY
※ ASSUME TRANSMISSION DELAY TIME IS ONE UNIT OF TIME

B TO A
CORRECT ANSWER →SWAP FOR X ONLY

| TIME | TRPN A | | | TRPN A | | |
|---|---|---|---|---|---|---|
| | IQswap STATE | TRANSMITTED SV INSTRUCTION COMMAND | RECEIVED SV NOTIFICATION VALUE | RECEIVED SV INSTRUCTION COMMAND | IQswap STATE | TRANSMITTED SV NOTIFICATION VALUE |
| 0 | NO SWAP | NO SWAP | N/A | N/A | N/A | N/A |
| 1 | NO SWAP | NO SWAP | N/A | N/A | N/A | N/A |
| 2 | NO SWAP | NO SWAP | N/A | N/A | N/A | N/A |
| 3 | NO SWAP | SWAP FOR X ONLY | N/A | N/A | N/A | N/A |
| 4 | NO SWAP | SWAP FOR X ONLY | N/A | N/A | N/A | N/A |
| 5 | NO SWAP | SWAP FOR X ONLY | N/A | N/A | N/A | N/A |
| 6 | NO SWAP | SWAP FOR Y ONLY | N/A | N/A | N/A | N/A |
| 7 | NO SWAP | SWAP FOR Y ONLY | N/A | N/A | N/A | N/A |
| 8 | NO SWAP | SWAP FOR Y ONLY | N/A | N/A | N/A | N/A |
| 9 | NO SWAP | SWAP FOR BOTH X AND Y | N/A | N/A | N/A | N/A |
| 10 | NO SWAP | SWAP FOR BOTH X AND Y | N/A | N/A | N/A | N/A |
| 11 | NO SWAP | SWAP FOR BOTH X AND Y | N/A | N/A | N/A | N/A |
| 12 | X ONLY swap | NO SWAP | N/A | N/A | N/A | N/A |
| 13 | X ONLY swap | NO SWAP | N/A | N/A | N/A | N/A |
| 14 | X ONLY swap | NO SWAP | N/A | N/A | N/A | N/A |
| 15 | X ONLY swap | SWAP FOR X ONLY | N/A | N/A | N/A | N/A |
| 16 | X ONLY swap | SWAP FOR X ONLY | N/A | N/A | N/A | N/A |
| 17 | X ONLY swap | SWAP FOR X ONLY | N/A | N/A | N/A | N/A |
| 18 | X ONLY swap | SWAP FOR Y ONLY | N/A | N/A | N/A | N/A |
| 19 | X ONLY swap | SWAP FOR Y ONLY | N/A | N/A | N/A | N/A |
| 20 | X ONLY swap | SWAP FOR Y ONLY | N/A | N/A | N/A | N/A |
| 21 | X ONLY swap | SWAP FOR BOTH X AND Y | N/A | N/A | N/A | N/A |
| 22 | X ONLY swap | SWAP FOR BOTH X AND Y | N/A | N/A | N/A | N/A |
| 23 | X ONLY swap | SWAP FOR BOTH X AND Y | N/A | N/A | N/A | N/A |
| 24 | SWAP FOR Y ONLY | NO SWAP | N/A | N/A | N/A | N/A |
| 25 | SWAP FOR Y ONLY | NO SWAP | N/A | N/A | N/A | 1 |
| 26 | SWAP FOR Y ONLY | NO SWAP | N/A | N/A | N/A | 1 |
| 27 | SWAP FOR Y ONLY | SWAP FOR X ONLY | N/A | N/A | N/A | 1 |
| 28 | SWAP FOR Y ONLY | SWAP FOR X ONLY | N/A | SWAP FOR X ONLY | SWAP FOR X ONLY | 1 |
| 29 | SWAP FOR Y ONLY | SWAP FOR X ONLY | 1 | SWAP FOR X ONLY | SWAP FOR X ONLY | 1 |
| 30 | SWAP FOR Y ONLY | NO SWAP | 1 | SWAP FOR X ONLY | SWAP FOR X ONLY | 1 |
| 31 | SWAP FOR Y ONLY | NO SWAP | 1 | N/A | SWAP FOR X ONLY | 1 |
| 32 | SWAP FOR Y ONLY | NO SWAP | 1 | N/A | SWAP FOR X ONLY | 1 |
| 33 | SWAP FOR Y ONLY | NO SWAP | 1 | N/A | SWAP FOR X ONLY | 1 |

FIG. 11B

| | TRPN A | | | TRPN A | | |
|---|---|---|---|---|---|---|
| | IQswap STATE | TRANSMITTED SV | RECEIVED SV | RECEPTION SV | IQswap STATE | RECEIVED SV |
| | | INSTRUCTION COMMAND | NOTIFICATION VALUE | INSTRUCTION COMMAND | | NOTIFICATION VALUE |
| 0 | NO SWAP | NO SWAP | N/A | N/A | N/A | N/A |
| 1 | NO SWAP | NO SWAP | N/A | N/A | N/A | N/A |
| 2 | NO SWAP | NO SWAP | N/A | N/A | N/A | N/A |
| ... | ... | ... | ... | ... | ... | ... |
| 24 | SWAP FOR Y ONLY | NO SWAP | N/A | N/A | N/A | N/A |
| 25 | SWAP FOR Y ONLY | NO SWAP | N/A | N/A | N/A | N/A |
| 26 | SWAP FOR Y ONLY | NO SWAP | N/A | N/A | N/A | N/A |
| 27 | SWAP FOR Y ONLY | SWAP FOR X ONLY | N/A | N/A | N/A | 1 |
| 28 | SWAP FOR Y ONLY | SWAP FOR X ONLY | N/A | SWAP FOR X ONLY | SWAP FOR X ONLY | 1 |
| 29 | SWAP FOR Y ONLY | SWAP FOR X ONLY | 1 | SWAP FOR X ONLY | SWAP FOR X ONLY | 1 |
| 30 | SWAP FOR Y ONLY | NO SWAP | 1 | SWAP FOR X ONLY | SWAP FOR X ONLY | 1 |
| 31 | SWAP FOR Y ONLY | NO SWAP | 1 | N/A | SWAP FOR X ONLY | 1 |
| 32 | SWAP FOR Y ONLY | NO SWAP | 1 | N/A | SWAP FOR X ONLY | 1 |
| 33 | SWAP FOR Y ONLY | NO SWAP | 1 | N/A | SWAP FOR X ONLY | 1 | t=0: TRPN A TRANSMITS FSK WHILE CHANGING INSTRUCTION COMMAND FOR EACH PHASE ROTATION STATE OF ITS OWN t=2: TRANSMIT SAME COMMAND FOR 3 UNITS OF TIME UNTIL REPLY COMES t=24: FSK RECEPTION BY TRPN IS NOT SUCCESSFUL SINCE IQswap STATE OF TRPN A IS WRONG SO FAR
t=25: FSK RECEPTION BY TRPN B IS SUCCESSFUL HERE, AND TRPN B SETS INSTRUCTED IQswap STATE
t=26: RECEPTION BY TRPN A IS NOT SUCCESSFUL SINCE IQswap STATE OF TRPN B IS WRONG
t=27: SWITCH TO NEXT INSTRUCTION COMMAND t=29: COMPLETE SETTING UPON RECEIPT OF PREDETERMINED NOTIFICATION VALUE (SET TO 1) BY TRPN A, NO CHANGE THEREAFTER

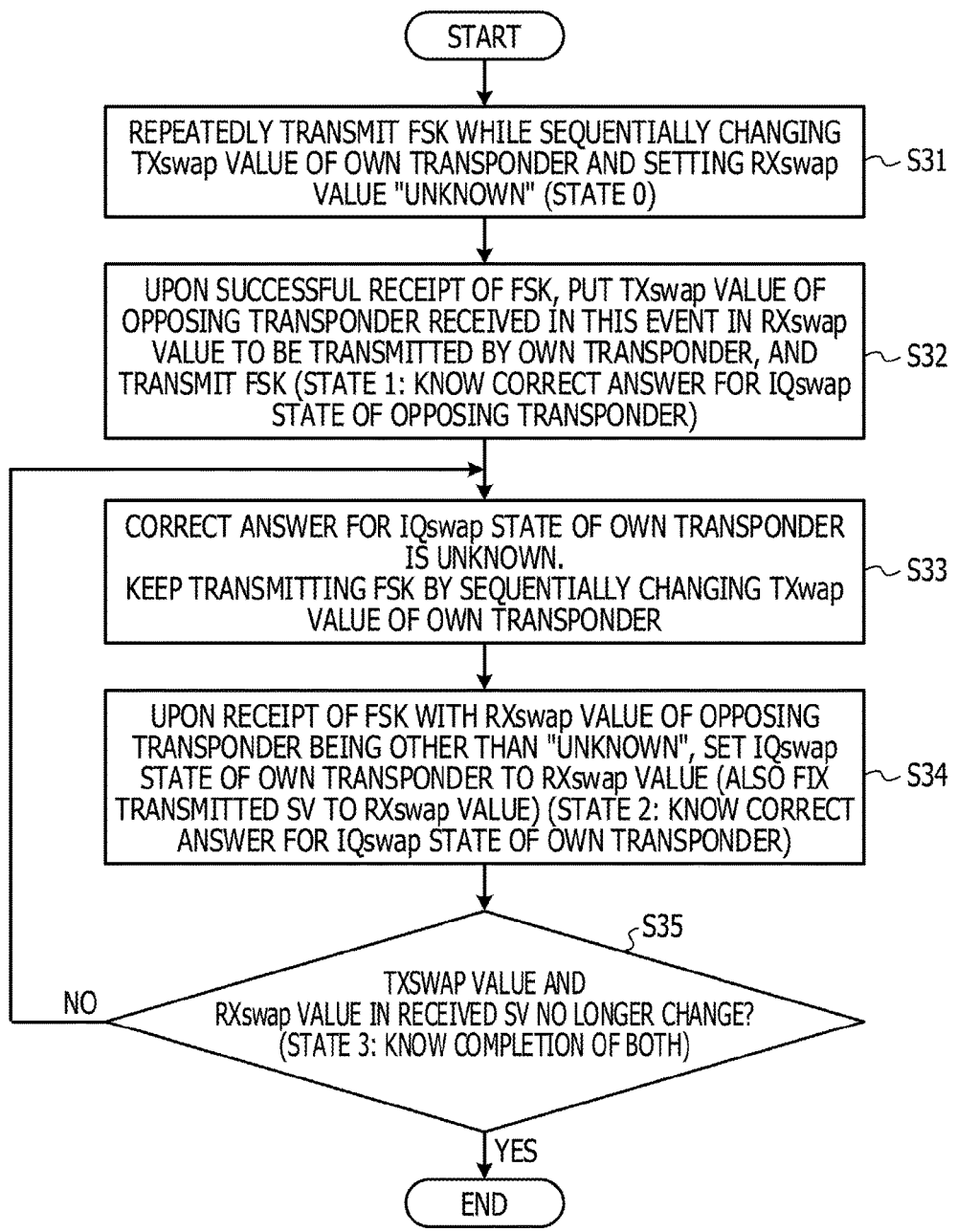

FIG. 18

| STATE | DETAILS OF STATE | CONDITIONS FOR TRANSITION | OPERATION | VALUE OF SV TO BE TRANSMITTED | |
|---|---|---|---|---|---|
| | | | | TXswap VALUE | RXswap VALUE |
| STATE 0 | STATE WHERE CORRECT IQswap STATE OF OWN TRANSPONDER AND CORRECT IQswap STATE OF OPPOSING TRANSPONDER ARE BOTH UNKNOWN | INITIAL STATE | TRANSIT SV WHILE CHANGING IQswap STATE OF OWN TRANSPONDER | SWITCH | UNKNOWN |
| STATE 1 | STATE WHERE CORRECT IQswap STATE OF OWN TRANSPONDER IS UNKNOWN BUT CORRECT IQswap STATE OF OPPOSING TRANSPONDER IS KNOWN | WHEN FSK RECEPTION IS SUCCESSFUL | ASSIGN TXswap VALUE RECEIVED FROM OPPOSING TRANSPONDER TO RXswap VALUE OF OWN TRANSPONDER | SWITCH | FIXED TO RECEIVED TXswap VALUE |
| STATE 2 | STATE WHERE CORRECT IQswap STATE OF OWN TRANSPONDER AND CORRECT IQswap STATE OF OPPOSING TRANSPONDER ARE BOTH KNOWN | WHEN FSK RECEPTION IS SUCCESSFUL AND RXswap VALUE IS OTHER THAN "UNKNOWN" | FIX IQswap STATE OF OWN TRANSPONDER TO RECEIVED RXswap VALUE | FIXED TO RECEIVED RXswap VALUE | FIXED TO RECEIVED TXswap VALUE |
| STATE 3 | STATE WHERE STATE WHERE CORRECT IQswap STATE OF OWN TRANSPONDER AND CORRECT IQswap STATE OF OPPOSING TRANSPONDER ARE BOTH KNOWN AND OPPOSING TRANSPONDER ALSO KNOWS THE BOTH | FSK RECEPTION IS CONTINUOUSLY SUCCESSFUL AND RXswap VALUE IS OTHER THAN "UNKNOWN" | COMPLETE IQswap DETERMINATION PROCESSING | FIXED TO RECEIVED RXswap VALUE | FIXED TO RECEIVED TXswap VALUE |

FIG. 19

A TO B
CORRECT ANSWER →SWAP FOR BOTH X AND Y
※ ASSUME TRANSMISSION DELAY TIME IS 6 UNITS OF TIME

B TO A
CORRECT ANSWER →SWAP FOR Y ONLY

| TIME | | TRPN A (TRANSPONDER 2A) | | | | TRPN B (TRANSPONDER 2B) | | | | |
|---|---|---|---|---|---|---|---|---|---|---|
| | | TRANSMITTED SV | | RECEIVED SV | | RECEIVED SV | | TRANSMITTED SV | | |
| | | TXswap | RXswap | TXswap | RXswap | TXswap | RXswap | TXswap | RXswap | |
| 0 | | NONE | UNKNOWN | N/A | N/A | N/A | N/A | NONE | UNKNOWN | |
| 1 | | X | UNKNOWN | N/A | N/A | N/A | N/A | X | UNKNOWN | |
| 2 | | Y | UNKNOWN | N/A | N/A | N/A | N/A | Y | UNKNOWN | |
| 3 | STATE 0 | XY | UNKNOWN | N/A | N/A | N/A | N/A | XY | UNKNOWN | STATE 0 |
| 4 | | NONE | UNKNOWN | N/A | N/A | N/A | N/A | NONE | UNKNOWN | |
| 5 | | X | UNKNOWN | N/A | N/A | N/A | N/A | X | UNKNOWN | |
| 6 | | Y | UNKNOWN | N/A | N/A | N/A | N/A | Y | UNKNOWN | |
| 7 | | XY | UNKNOWN | N/A | N/A | N/A | N/A | XY | UNKNOWN | |
| 8 | | NONE | Y | Y | UNKNOWN | N/A | N/A | NONE | UNKNOWN | |
| 9 | | X | Y | N/A | N/A | XY | UNKNOWN | X | XY | |
| 10 | | Y | Y | N/A | N/A | N/A | N/A | Y | XY | |
| 11 | STATE 1 | XY | Y | N/A | N/A | N/A | N/A | XY | XY | STATE 1 |
| 12 | | NONE | Y | Y | UNKNOWN | N/A | N/A | NONE | XY | |
| 13 | | X | Y | N/A | N/A | XY | UNKNOWN | X | XY | |
| 14 | | Y | Y | N/A | N/A | N/A | N/A | Y | XY | |
| 15 | | XY | Y | N/A | N/A | N/A | N/A | XY | N/A | |
| 16 | | XY | Y | Y | XY | N/A | N/A | NONE | XY | |
| 17 | | XY | Y | N/A | N/A | XY | Y | Y | XY | |
| 18 | STATE 2 | XY | Y | N/A | N/A | N/A | N/A | Y | XY | STATE 2 |
| 19 | | XY | Y | N/A | N/A | N/A | N/A | Y | XY | |
| 20 | | XY | Y | Y | XY | N/A | N/A | Y | XY | |
| 21 | | XY | Y | N/A | N/A | XY | Y | Y | XY | |
| 22 | | XY | Y | N/A | N/A | XY | Y | Y | XY | |
| 23 | | XY | Y | Y | XY | XY | Y | Y | XY | |
| 24 | STATE 3 | XY | Y | Y | XY | XY | Y | Y | XY | STATE 3 |
| 25 | | XY | Y | Y | XY | XY | Y | Y | XY | |
| 26 | | XY | Y | Y | XY | XY | Y | Y | XY | |

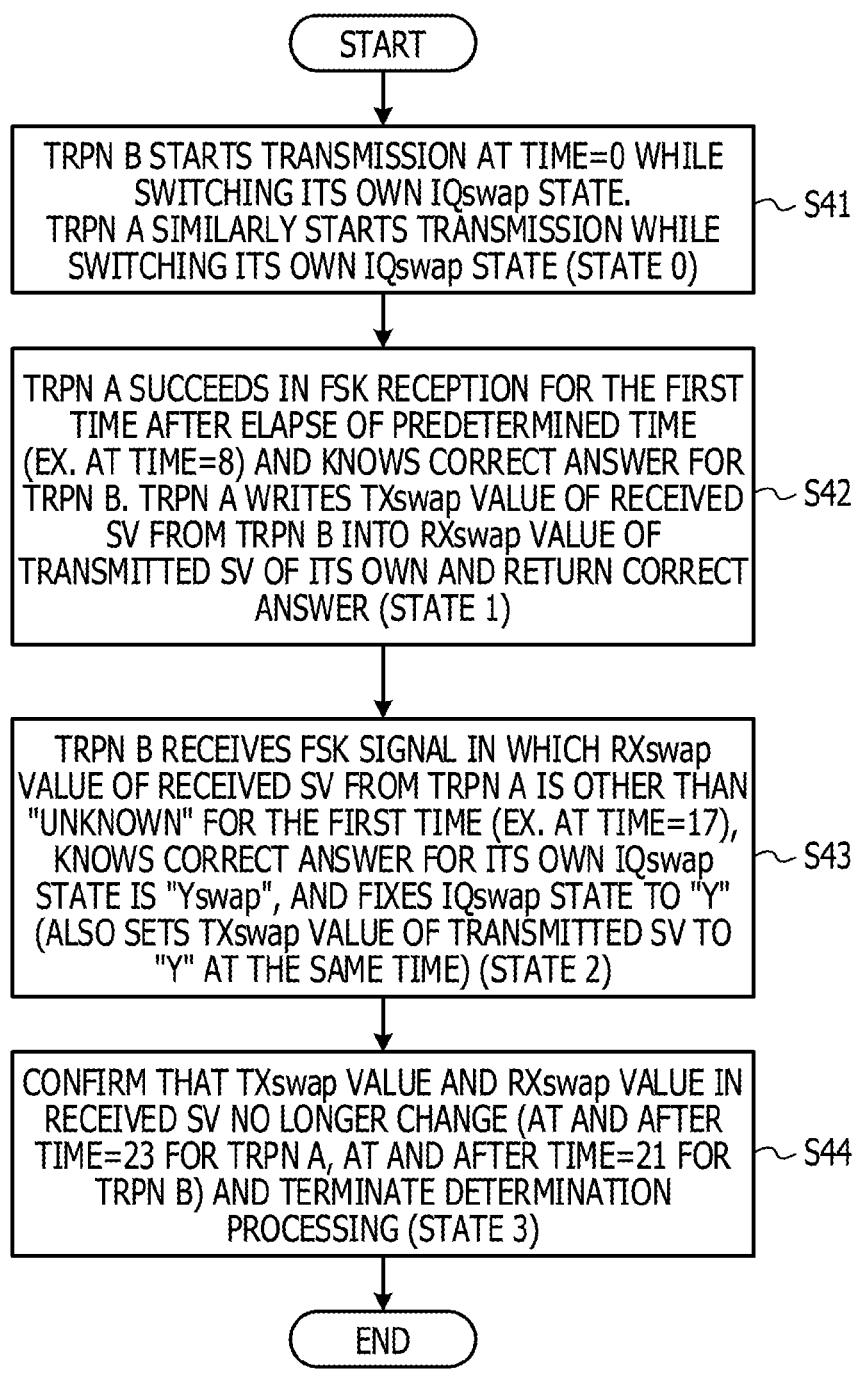

FIG. 21

|  | A TO B<br>CORRECT ANSWER →SWAP FOR BOTH X AND Y<br>※ ASSUME TRANSMISSION DELAY TIME IS<br>6 UNITS OF TIME | | | | B TO A<br>CORRECT ANSWER →SWAP FOR Y ONLY | | | | |
|---|---|---|---|---|---|---|---|---|---|
| | TRPN A (TRANSPONDER 2A) | | | | TRPN B (TRANSPONDER 2B) | | | | |
| | TRANSMITTED SV | | RECEIVED SV | | RECEIVED SV | | TRANSMITTED SV | | |
| TIME | TXswap | RXswap | TXswap | RXswap | TXswap | RXswap | TXswap | RXswap | |
| 0 | N/A | N/A | N/A | N/A | N/A | N/A | NONE | UNKNOWN | STATE 0 |
| 1 | N/A | N/A | N/A | N/A | N/A | N/A | X | UNKNOWN | |
| 2 | N/A | N/A | N/A | N/A | N/A | N/A | Y | UNKNOWN | |
| 3 | N/A | N/A | N/A | N/A | N/A | N/A | XY | UNKNOWN | |
| 4 | N/A | N/A | N/A | N/A | N/A | N/A | NONE | UNKNOWN | |
| 5 | N/A | N/A | N/A | N/A | N/A | N/A | X | UNKNOWN | |
| 6 | N/A | N/A | N/A | N/A | N/A | N/A | Y | UNKNOWN | |
| 7 | N/A | N/A | N/A | N/A | N/A | N/A | XY | UNKNOWN | |
| 8 | NONE | Y | Y | UNKNOWN | N/A | N/A | NONE | UNKNOWN | |
| 9 | X | Y | N/A | N/A | N/A | N/A | X | UNKNOWN | |
| 10 | Y | Y | N/A | N/A | N/A | N/A | Y | UNKNOWN | |
| 11 | XY | Y | N/A | N/A | N/A | N/A | XY | UNKNOWN | |
| 12 | NONE | Y | Y | UNKNOWN | N/A | N/A | NONE | UNKNOWN | |
| 13 | X | Y | N/A | N/A | N/A | N/A | X | UNKNOWN | |
| 14 | Y | Y | N/A | N/A | N/A | N/A | Y | UNKNOWN | |
| 15 | XY | Y | N/A | N/A | N/A | N/A | XY | UNKNOWN | |
| 16 | NONE | Y | Y | UNKNOWN | N/A | N/A | NONE | UNKNOWN | |
| 17 | X | Y | N/A | N/A | XY | Y | Y | XY | |
| 18 | Y | Y | N/A | N/A | N/A | N/A | Y | XY | |
| 19 | XY | Y | N/A | N/A | N/A | N/A | Y | XY | |
| 20 | NONE | Y | Y | UNKNOWN | N/A | N/A | Y | XY | |
| 21 | XY | Y | N/A | N/A | XY | Y | Y | XY | |
| 22 | XY | Y | N/A | N/A | N/A | N/A | Y | XY | STATE 2 |
| 23 | XY | Y | Y | XY | N/A | N/A | Y | XY | |
| 24 | XY | Y | Y | XY | N/A | N/A | Y | XY | |
| 25 | XY | Y | Y | XY | XY | Y | Y | XY | |
| 26 | XY | Y | Y | XY | N/A | N/A | Y | XY | |
| 27 | XY | Y | Y | XY | N/A | N/A | Y | XY | STATE 3 |
| 28 | XY | Y | Y | XY | N/A | N/A | Y | XY | |
| 29 | XY | Y | Y | XY | XY | Y | Y | XY | |
| 30 | XY | Y | Y | XY | XY | Y | Y | XY | STATE 3 |
| 31 | XY | Y | Y | XY | XY | Y | Y | XY | |
| 32 | XY | Y | Y | XY | XY | Y | Y | XY | |

TRANSMISSION SYSTEM AND METHOD

CROSS-REFERENCE TO RELATED APPLICATION

This application is based upon and claims the benefit of priority of the prior Japanese Patent Application No. 2017-138364, filed on Jul. 14, 2017, the entire contents of which are incorporated herein by reference.

FIELD

The embodiments discussed herein are related to a transmission system and a method.

BACKGROUND

The increase in communication volume and setting functions lead to increasing loads such as manual installation of a new transponder (hereinafter appropriately abbreviated as "TRPN") and maintenance of the existing TRPN. While setting of parameters such as a multi-value level and error correction is generally controlled by Software-Defined Networking (SDN), achieving a multivendor environment makes it difficult for the SDN to support all unique features of each company. Therefore, there has been desired a method wherein opposing TRPNs perform automatic control by directly exchanging supervisory (hereinafter abbreviated as "SV") signals without using the SDN in such a situation.

To realize an automatic control function, a configuration capable of transmitting and receiving SV signals with minimum setting is useful. As one example of such a method, an Frequency Shift Keying (FSK) method for superimposing a control channel on a carrier frequency has been proposed. A method for superimposing an SV signal on an FSK signal and transmitting the superimposed signal is called an "FSK-SV method". The FSK method is a method for changing the frequency of a carrier according to a logical value of data to be transmitted. In the case of polarization multiplexing, the receiving side receives an X-polarized wave and a Y-polarized wave without separating the both after the same value is superimposed thereon. A data value may be restored by the receiving side detecting the direction of a change in frequency.

A monitor configuration has also been proposed in which the receiving side monitors a signal transmitted by the FSK-SV method. This method is combined with control using the FSK-SV method to enable the SV signal to be transmitted and received even when no main signal is communicated.

In communication using the FSK-SV method, characteristics of an optical modulator or characteristics of an automatic bias control (ABC) circuit may cause a phenomenon that a phase rotation direction of an optical signal outputted from an IQ modulator is reversed or the phase of an optical output signal is π-radian shifted with respect to a drive signal. These phenomena are collectively called "reversal of phase rotation direction". When the phase rotation direction is reversed, bits are reversed or values are cancelled out, and thus the FSK-SV signal may no longer be properly received.

As illustrated in FIG. 1A, in the case of a proper phase rotation state (that is, the phase rotation direction is not reversed) at the output of the IQ modulator, the drive signal rotates the phase in the same direction (for example, clockwise) and shifts the frequencies in the same direction for both of the X-polarized wave and Y-polarized wave. The X-polarized wave and the Y-polarized wave are multiplexed and transmitted to an optical transmission line, and the transmitted data value may be determined by detecting the direction of a frequency shift at the receiving side.

FIG. 1B illustrates the case where the phase rotation direction is reversed for the X-polarized wave. For the Y-polarized wave, the phase rotates clockwise and the frequency shifts in a direction indicating a logical value of inputted data. For the X-polarized wave, the phase rotates counterclockwise and the frequency shifts in the opposite direction. When the X-polarized wave and the Y-polarized wave are multiplexed, a change in frequency is cancelled out and no data may be received by the receiving side.

To solve such a problem, there has been proposed a configuration in which reversal of an FSK signal superimposed on an optically modulated signal is detected and a bias voltage of an optical modulator is controlled in the event of the reversal, thereby changing a phase difference between an I-arm modulator and a Q-arm modulator by $\pi$. Prior art documents include Japanese Patent Nos. 5278001, 5712582, and 5870728, Japanese Laid-open Patent Publication No. 2016-34078, and Z. Tao et al., "Simple, Robust, and Wide-Range Frequency Offset Monitor for Automatic Frequency Control in Digital Coherent Receivers," ECOC 2007, pp. 1-2.

SUMMARY

According to an aspect of the invention, a transmission system includes a first transponder including a first I/Q modulator, and a second transponder including a second I/Q modulator, and configured to communicate with the first transponder using a frequency modulation scheme, wherein the first transponder is configured to set a first phase rotation mode in a first state for first light signal output from the first I/Q modulator, and transmit, to the second transponder, a first command to specify a second phase rotation mode for second light signal output from the second I/Q modulator, and the second transponder is configured to set, in response to the first command, the second phase rotation mode in a state specified by the first command.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A is a diagram illustrating a state where a phase rotation direction is not reversed in an IQ modulator.

FIG. 1B is a diagram illustrating a state where the phase rotation direction is reversed in the IQ modulator.

FIGS. 11A and 11B are diagrams illustrating operation example 1 between opposing transponders.

FIG. 17 is a flowchart illustrating operations performed by the transponders according to the second embodiment.

FIG. 18 is a diagram explaining a state transition of the transponders.

FIG. 19 is a diagram illustrating operation example 1 of the second embodiment.

FIG. 20 is a flowchart during the operation of FIG. 19.

FIG. 21 is a diagram illustrating operation example 2 of the second embodiment.

DESCRIPTION OF EMBODIMENTS

In the case where automatic control is performed between transponders, it is desirable that control using an FSK-SV method may be performed not only in one direction but also in both directions at once. Also, a configuration to bi-directionally and autonomously solve the problems of bit inversion and signal offset described above is desired.

Figure 2:
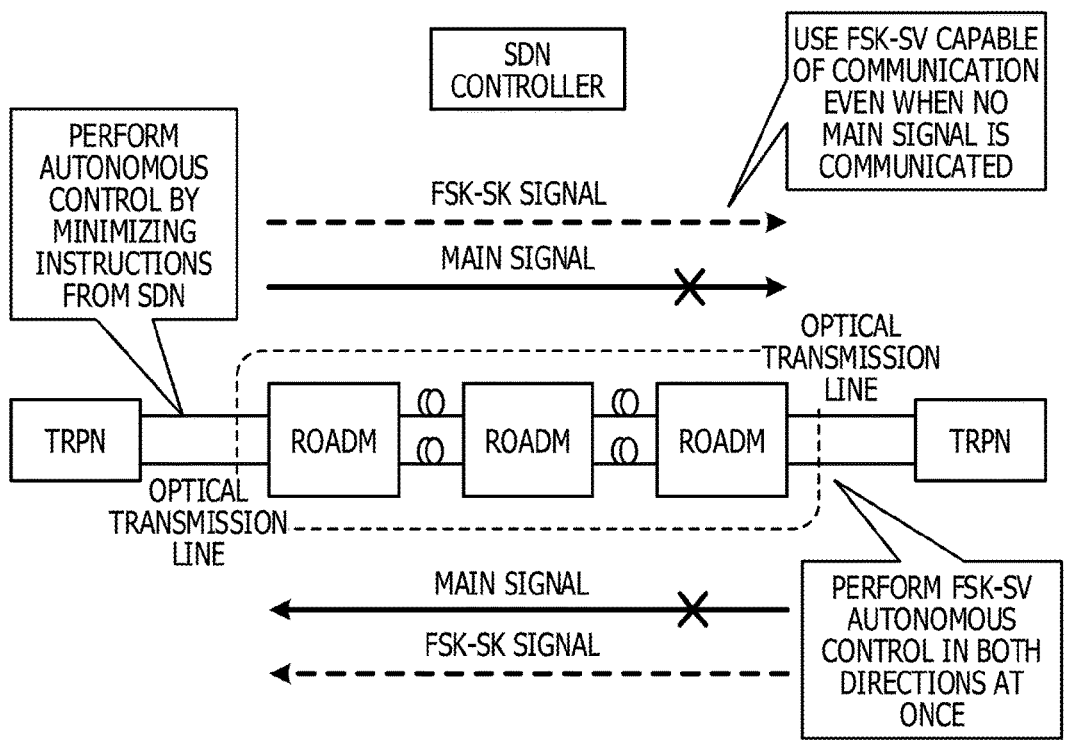
FIG. 2 is a schematic diagram of an optical transmission system to which an optical transmitter and an optical receiver are applied according to an embodiment.

FIG. 2 is a schematic diagram of an optical transmission system to which an optical transmitter and an optical receiver are applied according to an embodiment. A plurality of TRPNs are coupled to each other by optical transmission lines and reconfigurable optical add/drop multiplexers (ROADMs). In this optical transmission system, autonomous control is performed between the TRPNs while minimizing instructions from an SDN controller. As a method for the autonomous control, an FSK-SV method is employed, which enables communication even when no main signal is communicated.

In order to avoid the problems of bit inversion and signal offset with the FSK method, it is conceivable that an FSK signal is superimposed on one of polarized waves only or the amplitude is changed from one polarized wave to another. Thus, signals may be avoided from being cancelled out between the polarized waves. However, the bit inversion problem still remains, leading to poor signal quality of FSK transmission. In the embodiment, the problems of bit inversion and data value offset are solved by a collaborative operation using FSK-SV between opposing TRPNs. Accordingly, control to achieve an appropriate phase rotation state is autonomously and automatically performed in both directions.

First Embodiment

Figure 3:
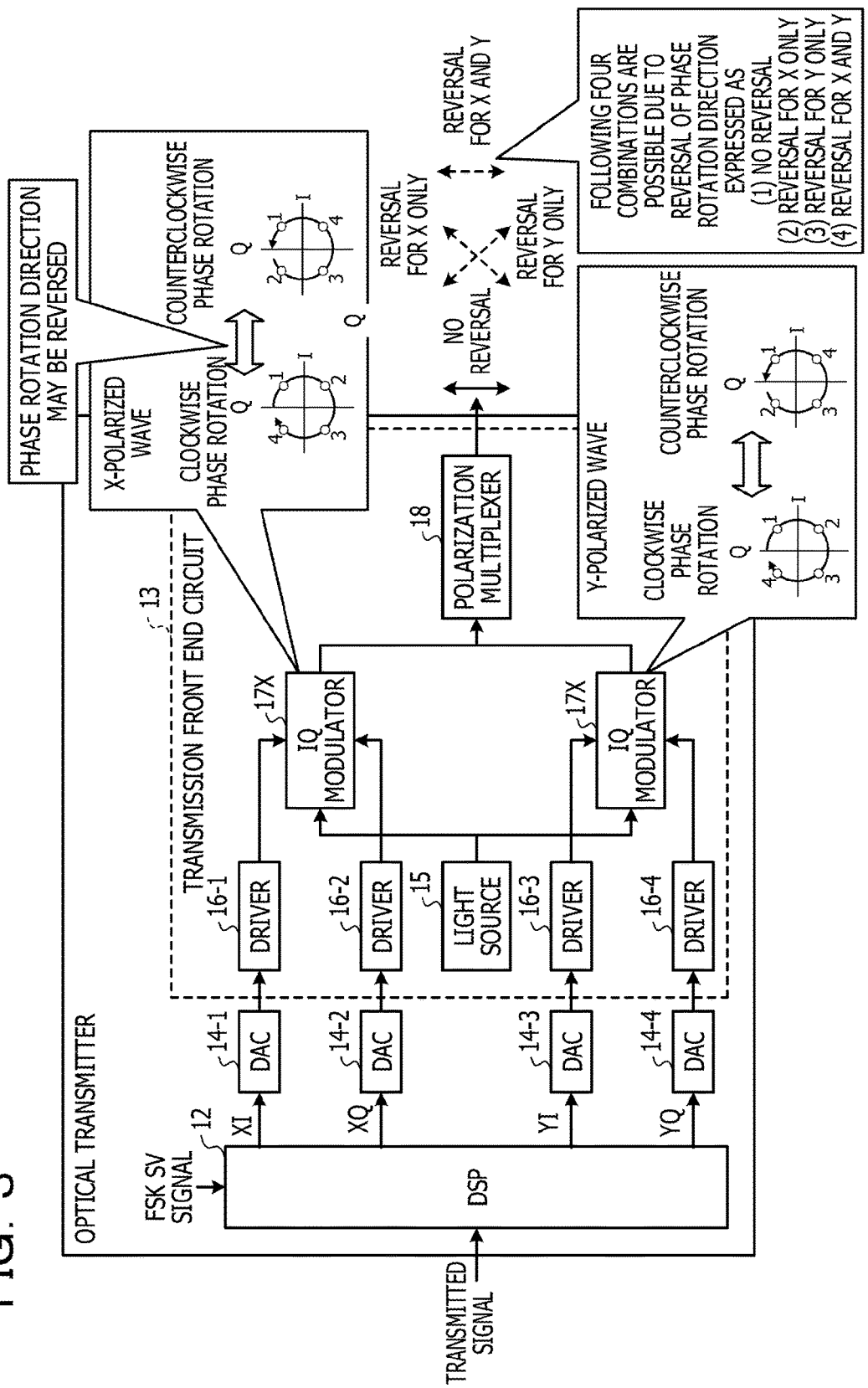
FIG. 3 is a diagram explaining the principles of a control method according to a first embodiment.

FIG. 3 is a diagram explaining the principles of control according to a first embodiment. A digital signal processor (DSP) 12 in an optical transmitter superimposes an FSK-SV signal on a transmitted signal. An I-channel signal (XI) and a Q-channel signal (XQ) of an X-polarized wave and an I-channel signal (YI) and a Q-channel signal (YQ) of a Y-polarized wave are outputted from the DSP 12, and converted into analog signals by corresponding DACs 14-1 to 14-4, and inputted to a transmission front-end circuit 13. The signals XI and XQ of the X-polarized wave are amplified by drivers 16-1 and 16-2, respectively, and then inputted to an I/Q modulator 17X. The signals YI and YQ of the Y-polarized wave are amplified by drivers 16-3 and 16-4, respectively, and then inputted to an I/Q modulator 17Y.

Light from a light source is split into an X-polarized wave and a Y-polarized wave by a polarization beam splitter or the like, which are guided to the I/Q modulator 17X and the I/Q modulator 17Y. The X-polarized wave made incident on the I/Q modulator 17X is modulated with signals outputted from the drivers 16-1 and 16-2. The Y-polarized wave made incident on the I/Q modulator 17Y is modulated with signals outputted from the drivers 16-3 and 16-4. In this event, characteristics of the I/Q modulators or characteristics of automatic bias control on the I/Q modulators may reverse a phase rotation direction during optical modulation by the I/Q modulators 17X and 17Y. While FIG. 3 depicts an example where the phase rotation direction is reversed in the I/Q modulator 17X, the following four cases may actually occur: (1) the case where the phase rotation direction is not reversed for any of the X-polarized wave and the Y-polarized wave ("no reversal"), (2) the case where the phase rotation direction is reversed for the X-polarized wave only ("reversal for X only"), (3) the case where the phase rotation direction is reversed for the Y-polarized wave only ("reversal for Y only"), and (4) the case where the phase rotation direction is reversed for both of the X-polarized wave and the Y-polarized wave ("reversal for X and Y"). In the TRPN of the opposing communication party, again, four phase rotation states may occur at the outputs from the I/Q modulators for the X-polarized wave and Y-polarized wave.

Therefore, four by four patterns are tested autonomously between the TRPNs to adjust the phase rotation state between the opposing TRPNs to an appropriate state. The phase rotation states of optical signals outputted from the I/Q modulators 17X and 17Y may be adjusted by control by the DSP 12. For example, in digital signal processing, the I-channel signal and Q-channel signal to be inputted to the I/Q modulator are swapped or the signs thereof are inverted, thereby allowing the phase rotation direction to be controlled. Such swapping of the I-channel and Q-channel or sign inversion processing performed before the input to the I/Q modulators 17X and 17Y is called an "IQ swap" for convenience. Moreover, a swap state between the I and Q channels set by the IQ swap processing is called an "IQ swap" state.

Figure 4:
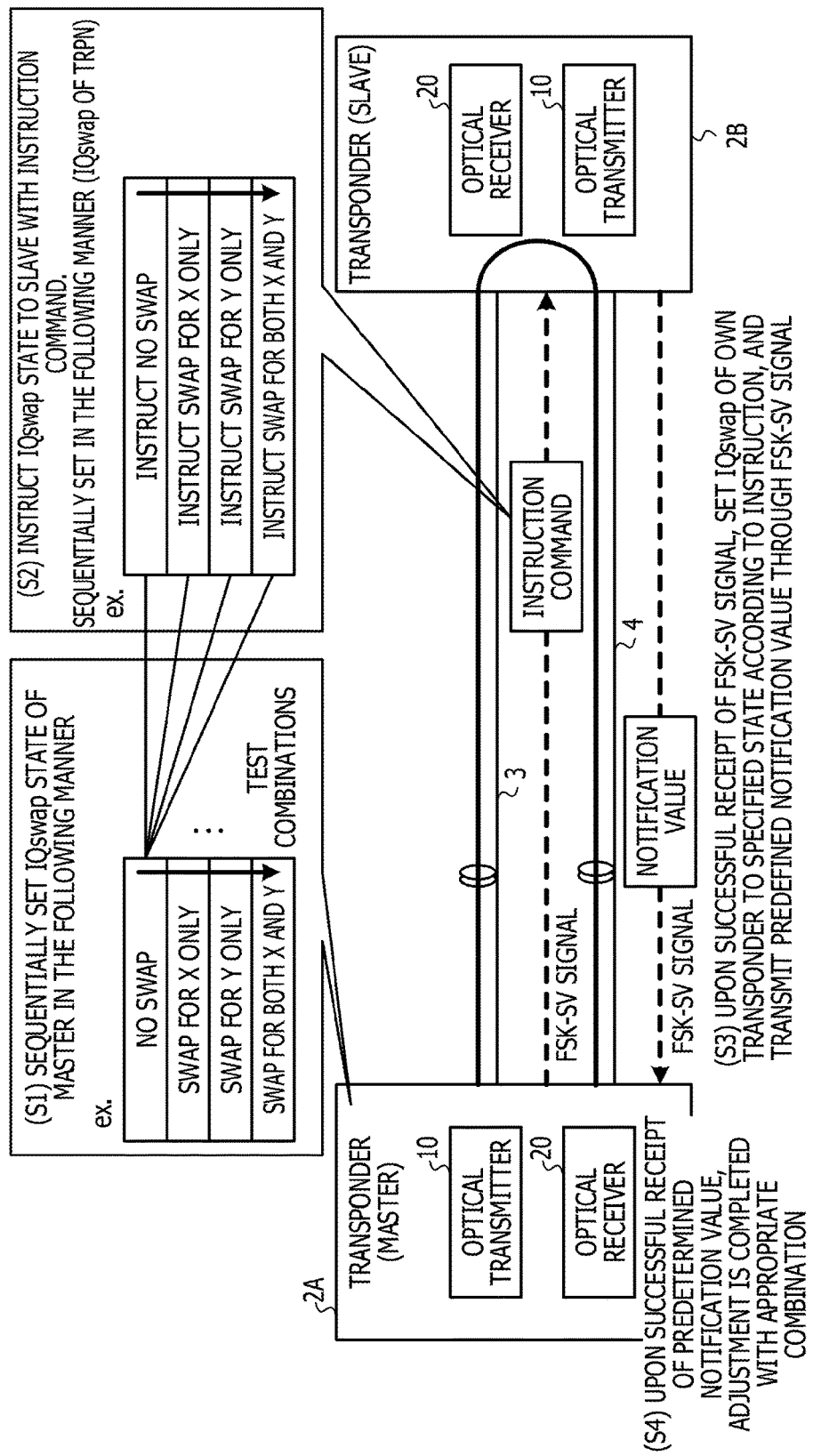
FIG. 4 is a diagram illustrating a control method in a transmission system according to the first embodiment.

FIG. 4 is a diagram illustrating a control method in the transmission system 1 according to the first embodiment. In the first embodiment, a master-slave collaborative operation using FSK-SV signals is performed between transponders 2A and 2B to control the phase rotation states of output optical signals from the modulators to be appropriate states in both directions. It is assumed here that the transponder 2A is the master and the transponder 2B is the slave.

In Step S1, the transponder 2A transmits, through an FSK-SV signal, an instruction command to switch the "IQ swap" state of the transponder 2B on the other side while sequentially switching its own "IQ swap" state. At the start of control, neither of the transponders 2A and 2B knows whether or not the phase rotation direction is reversed in the output of its own I/Q modulator. The transponder 2A sequentially switches its own "IQ swap" state in the following four ways: (1) a state where no IQ swap is performed at the input stage to the I/Q modulator for any of the X-polarized wave and the Y-polarized wave (this is called "no swap"), (2) a state where IQ swap is performed for the X-polarized wave only (this is called "swap for X only"), (3) a state where IQ swap is performed for the Y-polarized wave only (this is called "swap for Y only"), and (4) a state where IQ swap is performed for both of the X-polarized wave and the Y-polarized wave (this is called "swap for both X and Y").

The "IQ swap" state may be switched by the DSP 12 swapping the I-channel signal with the Q-channel signal, by inverting the sign of at least one of the I-channel and the Q-channel, or the like. The "IQ swap" state is adjusted for each of the X-polarized wave and the Y-polarized wave, and thus a signal to be inputted to the I/Q modulator is adjusted.

In Step S2, setting of the "IQ swap" state of the slave, that is, the transponder 2B is instructed in four instruction patterns for each phase rotation state of the I/Q modulator. For example, the "IQ swap" state of the master transponder 2A is set to "no swap", and "no swap", "swap for X only", "swap for Y only", and "swap for both X and Y" are sequentially instructed as the "IQ swap" state of the slave transponder 2B. After the transmission of the four kinds of instructions with the transponder 2A set to "no swap", the state thereof is switched to "swap for X only" and then four kinds of instructions are sequentially set again and transmitted. Thus, sixteen kinds of combinations are possible. Each instruction command is outputted as an FSK-SV signal from an optical transmitter 10 and transmitted to the slave transponder 2B through an optical transmission line 3.

In Step S3, upon successful receipt of the FSK-SV signal by an optical receiver 20, the transponder 2B sets its own "IQ swap" state to the instructed state according to the instruction command, and outputs a predetermined notification value indicating the successful receipt of the FSK-SV signal to an optical transmission line 4 through the FSK-SV signal.

In Step S4, when the transponder 2A successfully receives the notification value from the transponder 2B, the adjustment is completed knowing that the phase rotation states of the both optically modulated signals are set to appropriate states with a combination pattern in this event.

According to this method, the transponder 2A or 2B does not have to check the phase rotation direction by monitoring modulated output light for each polarized wave with a monitor PD or the like. Thus, the phase rotation states of the I/Q modulator outputs for both of the transponders 2A and 2B may be set to appropriate states by autonomous and automatic control between the transponders 2A and 2B.

Figure 5:
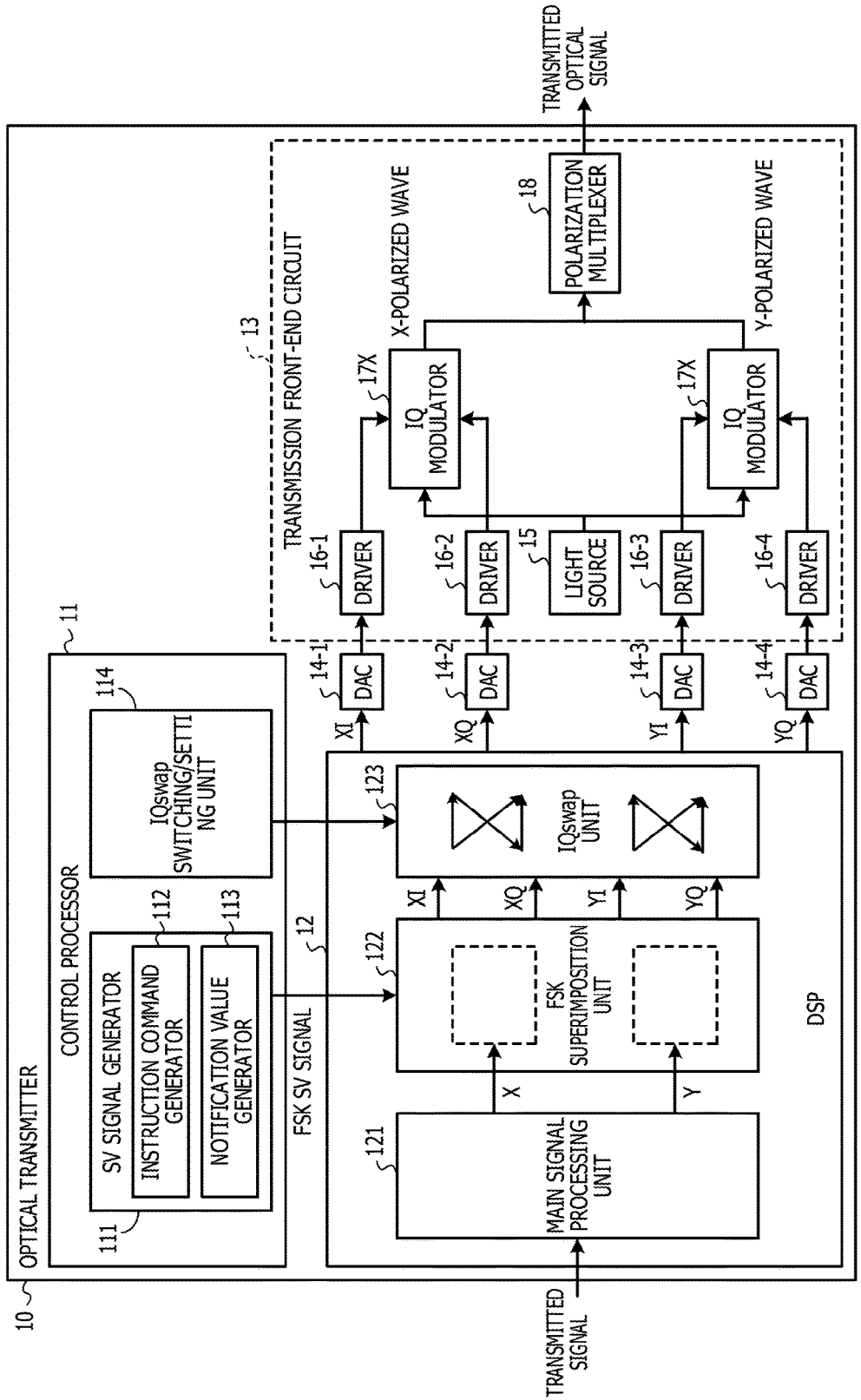
FIG. 5 is a block diagram illustrating a configuration example of an optical transmitter.

FIG. 5 is a block diagram illustrating a configuration of the optical transmitter 10. The optical transmitter 10 includes a control processor 11, a DSP 12, DACs 14-1 to 14-4, and a transmission front-end circuit 13. The control processor 11 includes an SV signal generator 111 and an IQ swap switching/setting unit 114. The DSP 12 includes a main signal processing unit 121, an FSK superimposition unit 122, and an IQ swap unit 123.

The IQ swap switching/setting unit 114 in the control processor 11 outputs an instruction to switch/set the "IQ swap" state to the IQ swap unit 123 in the DSP 12 at a predetermined timing before the start of operation or the like, for example. The instruction to switch/set the "IQ swap" state is an instruction to swap the I-channel and Q-channel signals to be inputted to the I/Q modulator 17 or an instruction to invert the sign of any one of the I-channel signal and the Q-channel signal (for example, to invert the sign of the Q-channel signal only).

The SV signal generator 111 includes an instruction command generator 112 and a notification value generator 113. The instruction command generator 112 sequentially generates an instruction command to switch the "IQ swap" state of the opposing transponder in four patterns, based on the instruction from the IQ swap switching/setting unit 114, when the transponder 2 including the optical transmitter 10 operates as the master. The generated instruction command is supplied as an FSK-SV signal to the FSK superimposition unit 122 in the DSP 12. The notification value generator 113 generates a predefined notification value in response to the receipt of the FSK-SV signal, when the transponder 2 including the optical transmitter 10 operates as the slave. The generated notification value is supplied as an FSK-SV signal to the FSK superimposition unit 122 in the DSP 12.

The main signal processing unit 121 in the DSP 12 performs digital signal processing to generate electric field information from a transmitted signal (user data) to be inputted and map the information at symbol points on an I-Q plane (or on a complex plane). When the modulation method is dual polarization-qpsk (DP-QPSK), the information is mapped at any of four symbol points on the I-Q plane for each of the X-polarized wave and Y-polarized wave according to a logical value of the transmitted data. The mapped electric field information contains an I (in-phase) component and a Q (quadrature) component, and is represented by $E=I+jQ=A(t) \times \exp(j\theta(t))$. Here, j is an imaginary unit, $A(t)$ is electric field intensity (amplitude), and $\theta(t)$ is an electric field phase. Note that a control signal or compensation data may be outputted as appropriate from the control processor 11 to the main signal processing unit 121.

The FSK superimposition unit 122 superimposes an FSK-SV signal on the inputted transmitted signal and separates the signal into an I-channel signal and a Q-channel signal before outputting the signals. Since a dual polarization modulation method is used in this example, the FSK superimposition unit 122 includes an FSK superimposition unit 122X for the X-polarized wave and an FSK superimposition unit 122Y for the Y-polarized wave, and performs superimposition of the FSK-SV signal and I-Q separation for each polarized wave.

Figure 6:
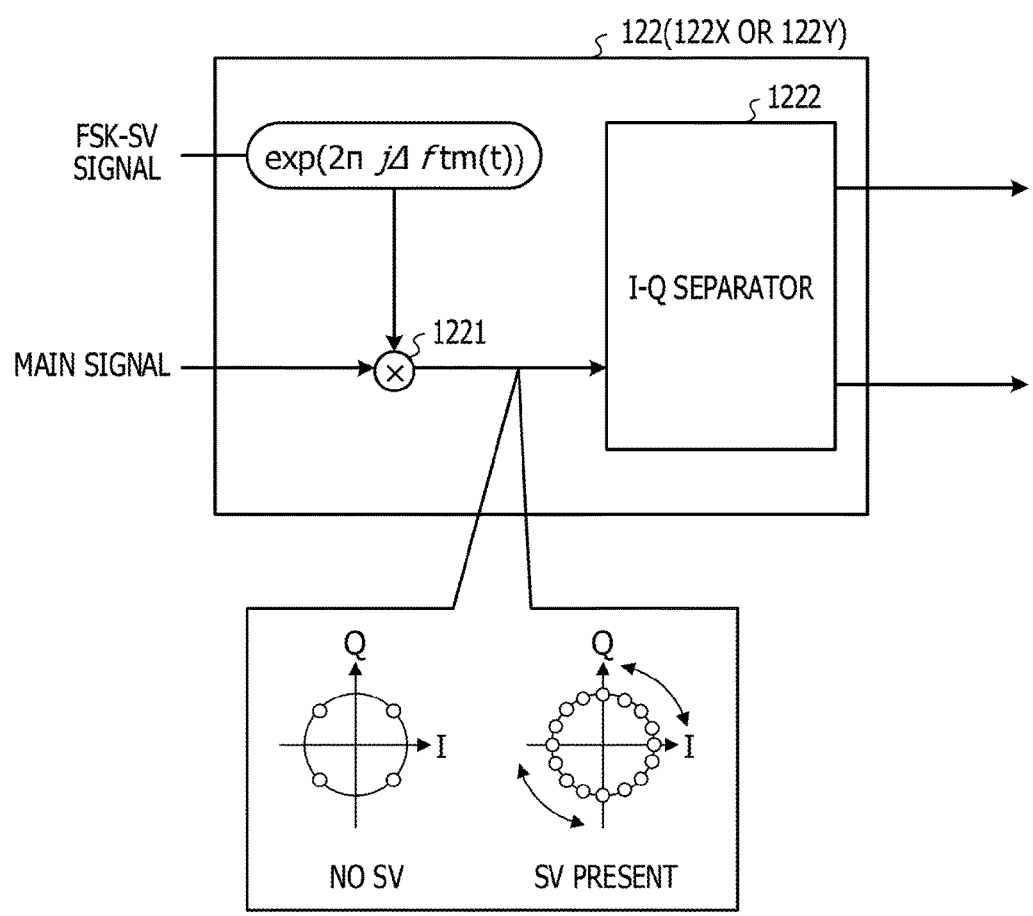
FIG. 6 is a diagram illustrating a configuration example of an FSK superimposition unit.

FIG. 6 illustrates a configuration example of the FSK superimposition unit 122. The FSK superimposition unit 122 includes a multiplier 1221 and an I-Q separator 1222. When there is an FSK-SV signal to be superimposed, an inputted main signal is multiplied by the FSK-SV signal by the multiplier 1221, and the signal thus obtained is inputted to the I-Q separator 1222. When there is no FSK-SV signal to be superimposed, only the main signal is inputted to the I-Q separator 1222.

The FSK-SV signal is represented by $\exp(2\pi j\Delta f tm(t))$. Here, $\Delta f$ is the maximum frequency shift of control signal modulation, and $m(t)$ is the waveform of an SV signal to be superimposed. $2\pi\Delta f tm(t)$ is a frequency offset component, and phase rotation of $2\pi\Delta f tm(t)$ or $-2\pi\Delta f tm(t)$ is given by the value of the SV signal.

When the FSK-SV signal is to be superimposed, an output $E'(t)$ from the multiplier 1221 is obtained as $E'(t)=E(t)*\exp(2\pi j\Delta f tm(t))$. When no SV signal is to be superimposed, the transmitted data is arranged at symbol points on the I-Q plane in a fixed manner as depicted in the lower left part of FIG. 6. When the SV signal is superimposed, the phase of the symbol is rotated by $2\pi\Delta f tm(t)$. The direction of the rotation varies according to the logical value ("0" or "1") of the SV signal.

The signal having the FSK-SV signal superimposed thereon is outputted after being separated into an I component (signal component corresponding to a real part) and a Q component (signal component corresponding to an imaginary part) by the I-Q separator 1222.

Referring back to FIG. 5, the IQ swap unit 123 swaps the I-channel and Q-channel signals to be inputted to the IQ modulator for each polarized wave, according to a switch signal outputted from the IQ swap switching/setting unit 114 or inverts the sign of any one of the I-channel and the Q-channel (plus sign to minus sign or minus sign to plus sign). There are four kinds of switch signals for the IQ swap processing as described above, including (1) "no swap" for performing no IQ swap for any of the X-polarized wave and the Y-polarized wave, (2) "swap for X only" for performing IQ swap for the X-polarized wave only, (3) "swap for Y only" for performing IQ swap for the Y-polarized wave only, and (4) "swap for both X and Y" for performing IQ swap for both of the X-polarized wave and the Y-polarized wave.

The electric signals XI, XQ, YI, and YQ after the IQ swap processing are converted into analog signals by the corresponding DACs 14-1 to 14-4, amplified by drivers 16-1 to 16-4, and then inputted to the I/Q modulator 17X for the X-polarized wave and the I/Q modulator 17Y for the Y-polarized wave. The I/Q modulator 17X for the X-polarized wave uses drive signals outputted from the drivers 16-1 and 16-2 to modulate the X-polarized wave outputted from a light source 15 and subjected to polarization separation. The I/Q modulator 17Y for the Y-polarized wave uses drive signals outputted from the drivers 16-3 and 16-4 to modulate the Y-polarized wave outputted from the light source 15 and subjected to polarization separation. The X-polarized and Y-polarized waves modulated with the drive signals are multiplexed by a polarization multiplexer 18 and outputted as optical signals. When the phase rotation direction of output light from the I/Q modulator is corrected to the right direction by the IQ swap processing, the FSK-SV signal is normally received by the transponder on the other side.

Figure 7:
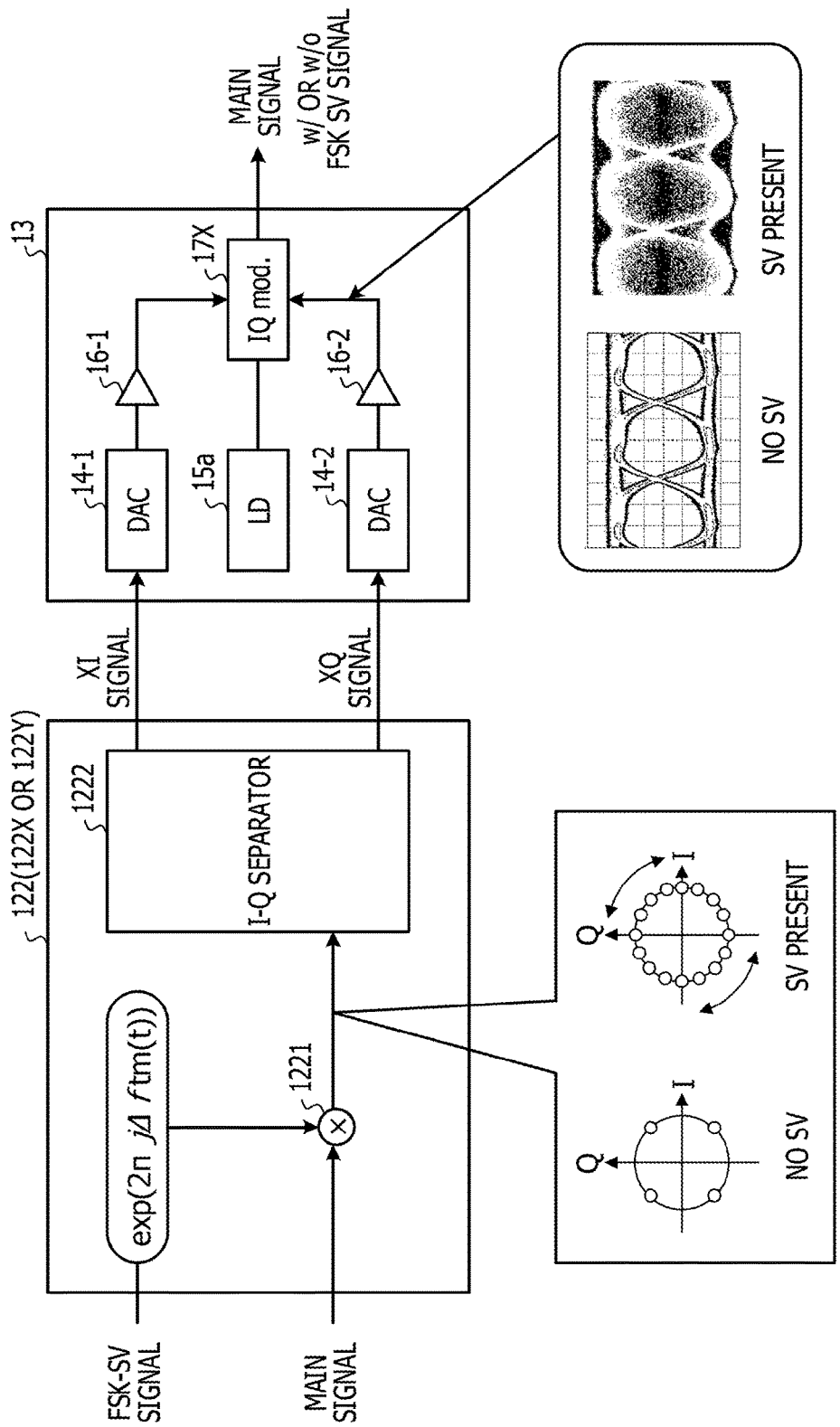
FIG. 7 is a diagram illustrating eye diagrams of an electric signal when an FSK-SV signal is superimposed thereon and when no FSK-SV signal is superimposed thereon.

FIG. 7 illustrates eye diagrams of an electric signal when an FSK-SV signal is superimposed thereon (w/) and when no FSK-SV signal is superimposed thereon (w/o). When no FSK-SV signal is superimposed, waveforms are superimposed on each other at the same timing and with the same voltage, resulting in opened eyes. On the other hand, when the FSK-SV signal is superimposed, a frequency (timing) fluctuation component is placed on the main signal. Although eye diagrams of a quadrature (Q-channel) signal is illustrated in the example of FIG. 7, eye diagrams of an in-phase (I-channel) signal also have the same waveforms depending on the presence or absence of the FSK-SV signal.

Figure 8:
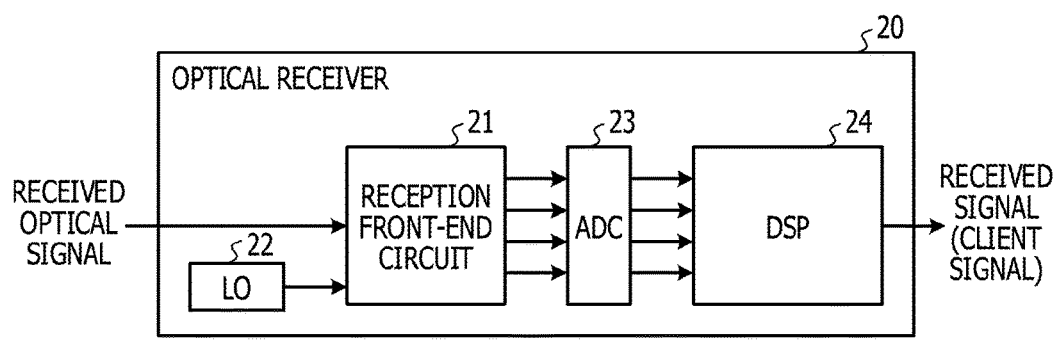
FIG. 8 is a diagram illustrating a configuration example of an optical receiver according to an embodiment.

FIG. 8 is a diagram illustrating a configuration example of the optical receiver 20 according to an embodiment. While FIG. 8 illustrates only a portion to process one of polarized components for convenience of illustration, the same processing is also performed with the same configuration for the other polarized component. The optical receiver 20 includes a reception front-end circuit 21, a local oscillator (LO) 22, an analog/digital converter (ADC) 23, and a DSP 24. The reception front-end circuit 21 is, for example, an integrated coherent receiver (ICR) having a 90° hybrid mixer and a balance PD. The ICR causes a received optical signal to interfere with locally emitted light from the LO 22, and uses the balance PD to extract a difference between a positive phase photocurrent and a negative phase photocurrent. When an FSK-SV signal is superimposed on the transmission side, the received optical signal includes the FSK-SV signal. The ADC 23 performs digital sampling of photocurrents outputted from the reception front-end circuit 21 to output digital data to the DSP 24. The DSP 24 retrieves the superimposed FSK-SV signal after or before compensating for waveform distortion and the like by digital signal processing.

Figure 9:
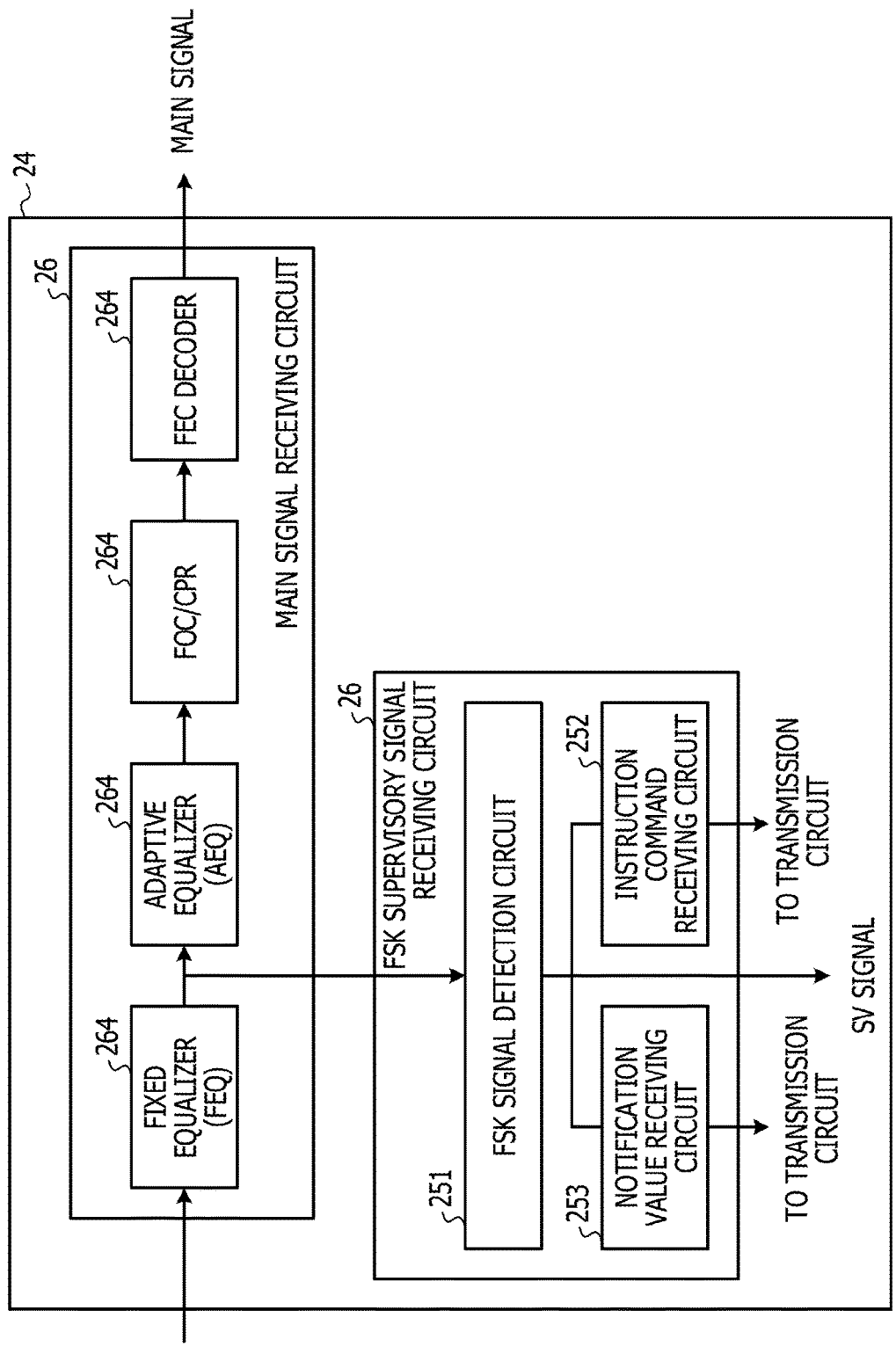
FIG. 9 is a block diagram illustrating a configuration example of a DSP.

FIG. 9 is a block diagram illustrating a configuration example of the DSP 24. The DSP 24 includes a main signal receiving circuit 26 and an FSK supervisory signal receiving circuit 25. The main signal receiving circuit 26 includes a fixed equalizer (FEQ) 261, an adaptive equalizer (AEQ) 262, a frequency offset compensation and carrier phase recovery (FOC-CPR) circuit 263, and a forward error correction code (FEC) decoder 264. The fixed equalizer 261 performs dispersion compensation, linear compensation, non-linear compensation, and the like. The adaptive equalizer 262 performs compensation of a differential group delay (DGD) between two polarization states perpendicular to each other, residual dispersion compensation, and the like. The frequency offset compensation and carrier phase recovery circuit 263 compensates for a difference between the carrier frequency of the received optical signal and the frequency of the locally emitted light, and recovers the carrier phase. A frequency offset amount is detected using a well-known method, and constellation is rotated backward at a phase rotation speed corresponding to a detected frequency error, thereby compensating for the frequency offset. The FEC decoder 264 corrects a bit error by decoding an error correction code.

The FSK supervisory signal receiving circuit 25 includes an FSK signal detection circuit 251, an instruction command receiving circuit 252, and a notification value receiving circuit 253. The FSK supervisory signal receiving circuit 25 retrieves the FSK signal after fixed equalization processing in the example of FIG. 9, but may retrieve the FSK signal before the fixed equalizer 261.

The FSK signal detection circuit 251 estimates a frequency offset amount attributable to a difference between the transmission carrier frequency and the frequency of the LO 22, for example, and demodulates the superimposed FSK-SV signal based on the result of the estimation. The frequency offset amount may be obtained using a heretofore known method. For example, an in-phase (I) component of the received signal is multiplied by a complex conjugate of a signal obtained by delaying a quadrature (Q) component by 1 symbol, while the Q component is multiplied by a complex conjugate of a signal obtained by delaying the I component by 1 symbol. Then, the two products thus obtained are added and averaged to obtain the frequency offset amount. In the demodulated FSK-SV signal, an instruction command to instruct setting of the "IQ swap" state is inputted to the instruction command receiving circuit 252 to recover the value of the SV signal. The instruction command receiving circuit 252 is used when the transponder including this optical receiver 20 operates as the slave. The instruction command receiving circuit 252 retrieves the instruction command and supplies the instruction command to the control processor 11 in the optical transmitter 10 of its own transponder.

In the demodulated FSK-SV signal, the notification value is inputted to the notification value receiving circuit 253, and the notification value is recovered. The notification value receiving circuit 253 is used when the transponder including this optical receiver 20 operates as the master. The notification value receiving circuit 253 retrieves the notification value and supplies the notification value to the control processor 11 in the optical transmitter 10 of its own transponder. The other SV signal is, for example, inputted to a processor shared by the optical transmitter 10 and the optical receiver 20 in the transponder for use in supervisory control between the transponders.

Figure 10:
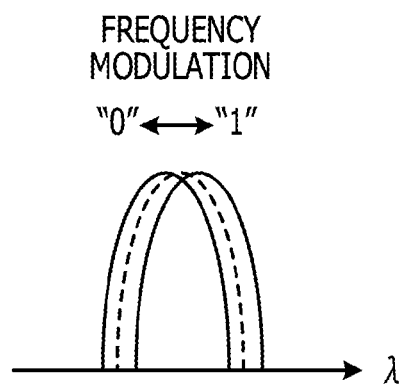
FIG. 10 is a diagram explaining the FSK-SV signal.

FIG. 10 is a diagram illustrating a transmission spectrum of the FSK-SV signal. The carrier frequency is shifted to the long-wavelength side or short-wavelength side by Δf to represent logical values "1" and "0" of the SV signal. On the receiving side, the value of the SV signal is recovered from the offset amount between the carrier frequency of the transmitted SV signal and the frequency of the LO 22.

<Operation Example of First Embodiment>

FIGS. 11A and 11B illustrate an operation example of autonomous control of the transponders 2A and 2B in the transmission system 1. It is assumed that "TRPN A" is the master transponder 2A and "TRPN B" is the slave transponder 2B. Neither of the transponders 2A and 2B knows about phase rotation directions of optical signals outputted from the IQ modulator for the X-polarized wave and the IQ modulator for the Y-polarized wave therein. In the transponder 2A, the phase rotation direction is reversed for the Y-polarized wave only, and the right "IQ swap" state to be set is "swap for Y only". In the transponder 2B, the phase rotation direction is reversed for the X-polarized wave only, and the right "IQ swap" state to be set is "swap for X only". It is also assumed that a transmission delay time is 1 unit of time. The transponder 2A transmits an instruction command to the transponder 2B through an FSK-SV signal while sequentially switching the "IQ swap" state set in its own IQ swap unit 123.

The transponder 2A keeps transmitting the same instruction command for 3 units of time, from time t=0 to t=2, desired to receive a response from the transponder 2B. For example, the transponder 2A sets the state of its own IQ swap unit 123 to "no swap", and transmits an instruction command indicating "no swap" to the transponder 2B. At this stage, there is no notification value yet to be sent from the transponder 2B through an FSK-SV signal ("n/a"). Then, the transponder 2A transmits FSK-SV signals by sequentially changing the instruction command to the transponder 2B to "swap for X only", "swap for Y only", and "swap for both X and Y" for every 3 units of time while maintaining its own "IQ swap" state to be "no swap".

The transponder 2B does not receive the FSK-SV signal until the phase rotation direction of the output light from the modulators for the X-polarized and Y-polarized waves coincides with the right direction, based on the "IQ swap" state set in the IQ swap unit 123. In this example, the right phase rotation state is not obtained until the IQ swap unit 123 in the transponder 2A is set to "swap for Y only" at t=24. Therefore, the FSK signal including the instruction command is not received by the transponder 2B.

The instruction command "no swap" transmitted in the right phase rotation state at t=24 is received by the transponder 2B at t=25. The transponder 2B sets its own IQ swap unit 123 to the "IQ swap" state of the instruction command, that is, "no swap", and transmits a predefined notification value "1" through an FSK-SV signal. However, since the actual phase rotation state of the transponder 2B is "reversal for X only", the right phase rotation state may not be obtained by processing of "no swap" set in the IQ swap unit 123 in the transponder 2B, and no notification value is received by the transponder 2A.

At t=27, the transponder 2A switches the instruction command to "swap for X only" and transmits an FSK-SV signal. At t=28, the transponder 2B sets the state of its own IQ swap unit 123 to "swap for X only" according to the received instruction command, and transmits the value "1" through an FSK-SV signal. The phase rotation state of the transponder 2B is corrected to the right phase rotation direction by the "swap for X only" processing, and the transponder 2A receives a notification value "1" at t=29. At this stage, the phase rotation direction in the I/Q modulator is set in the right state for both of the transponders 2A and 2B, and thus the setting is completed. The transponder 2B recognizes that its own "IQ swap" state is correctly set, since no instruction command is received from the transponder 2A within a predetermined period of time. Note that the transponder 2A may transmit setting complete notification to the transponder 2B at the next timing (t=30).

With this method, the "IQ swap" state of its own transponder is autonomously set to the right state between the transponders 2A and 2B without any control signal from the SDN controller, and the phase rotation direction of the output light from the modulators is set to the right direction. Thus, value offset and bit inversion may be reduced in the FSK-SV communication.

Figure 12:
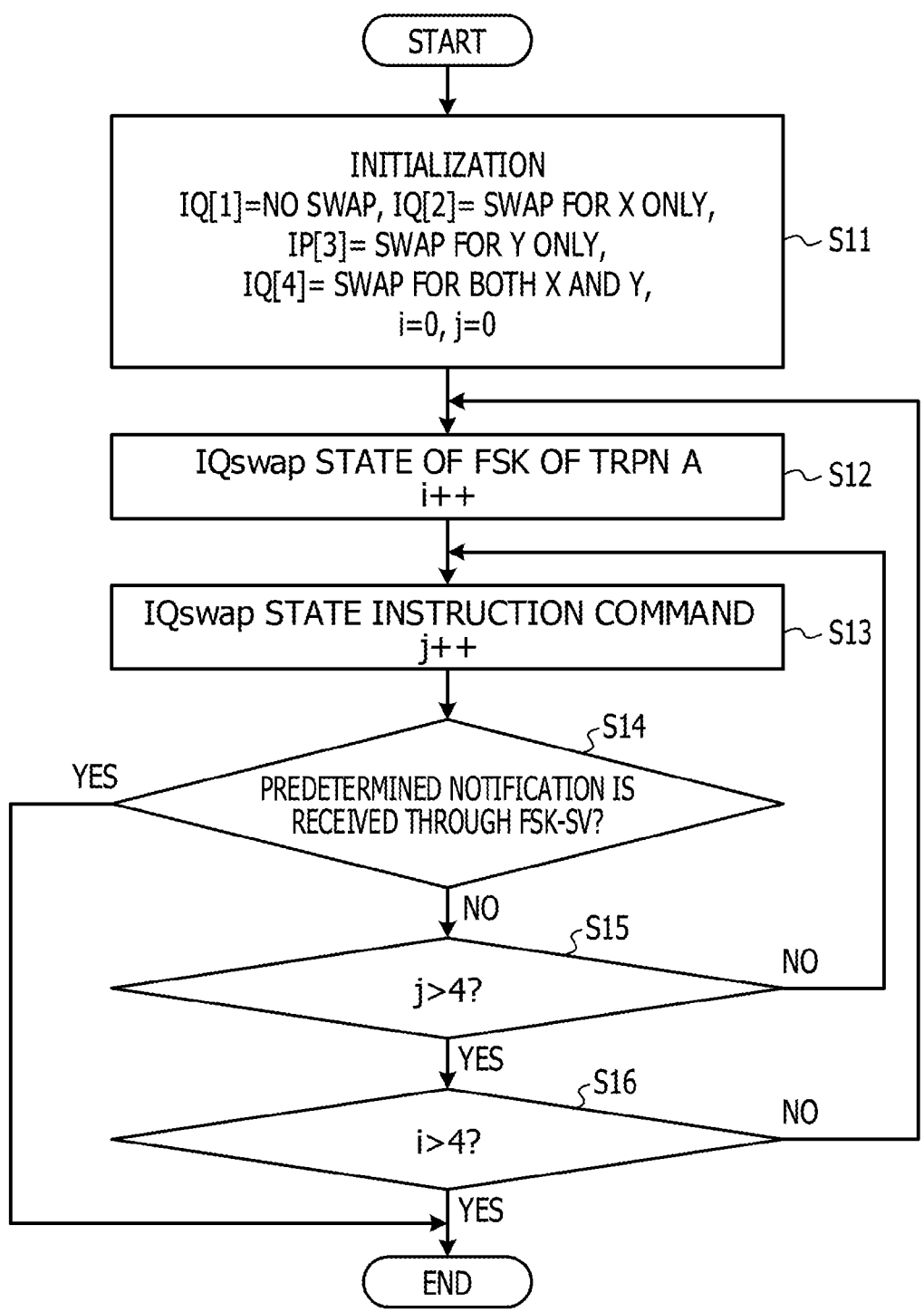
FIG. 12 is a flowchart illustrating a processing flow of a transponder 2A.

FIG. 12 illustrates a processing flow of the transponder 2A, that is, "TRPN A". First, an "IQ swap" value to be set in its own IQ swap unit 123 and an "IQ swap" value to be instructed to the opposing transponder 2B are initialized (Step S11). IQ[1] represents "no swap". IQ[2] represents "swap for X only". IQ[3] represents "swap for Y only". IQ[4] represents "swap for both X and Y". i is a state value set for the IQ swap unit 123 in the transponder 2A, while j is a state value included in the instruction command to the transponder 2B. The initialization in Step S11 sets i=0 and j=0.

Next, the value i is incremented for the setting of its own IQ swap unit 123 (Step S12), and then the value j in the instruction command IQ[j] to the transponder 2B on the other side is incremented (Step S13). Immediately after the initialization, the set state of the IQ swap unit 123 in the transponder 2A is "no swap" at this stage, and the instruction command to the transponder 2B is also "no swap".

The control processor 11 determines whether or not a specified notification value is received through an FSK-SV signal (Step S14). When the specified notification value is successfully received (YES in Step S14), the IQ swap unit 123 is correctly set in both of the transponders 2A and 2B, and thus the processing is terminated. When the specified notification value is not received in Step S14, it is determined whether or not the value j exceeds 4. Then, the value j is incremented until j=4, and Steps S13 to S15 are repeated.

When the value j exceeds 4 in Step S15, it is determined whether or not the value i exceeds 4 (Step S16). Then, the value i is incremented until i=4, and Steps S12 to S16 are repeated. Thereafter, 16 patterns are tested in round-robin fashion, and the processing is repeated until the specified notification value is received in Step S14. This method allows the phase rotation direction of the optical signal outputted from the I/Q modulator to be autonomously adjusted to the right state between the transponders 2A and 2B.

Figure 13:
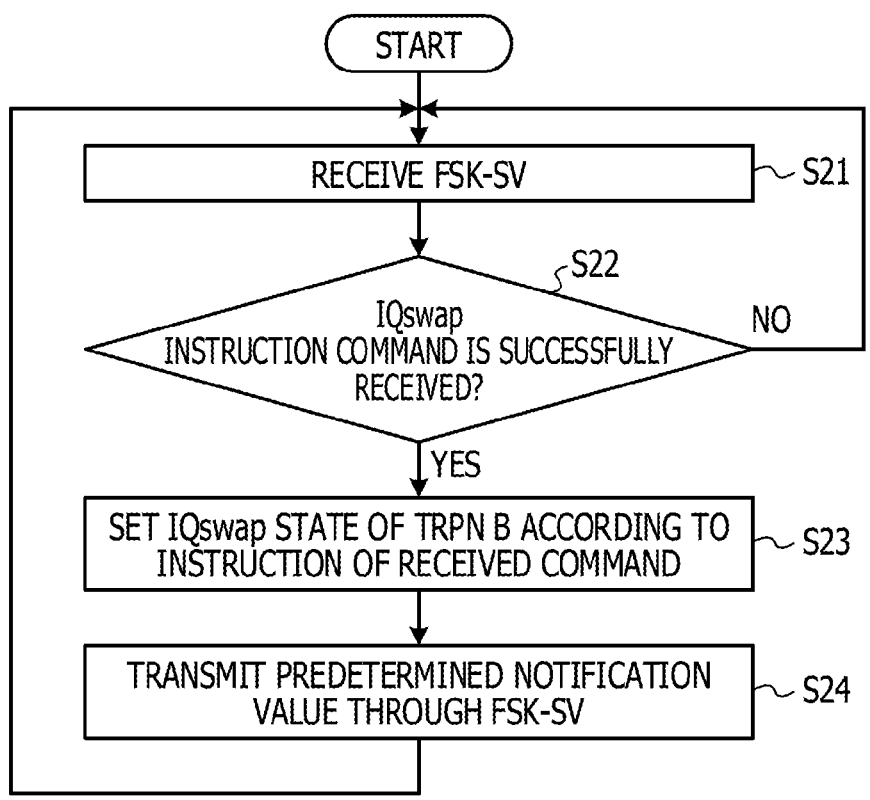
FIG. 13 is a flowchart illustrating a processing flow of a transponder 2B.

FIG. 13 illustrates a processing flow of the transponder 2B, that is, "TRPN B". The transponder 2B repeats receiving an FSK-SV signal until an "IQ swap" instruction command is successfully received (Step S21) and determining whether or not the instruction command is successfully received (Step S22). When the instruction command is successfully received (YES in Step S22), its own "IQ swap" state is set to the state instructed by the instruction command (Step S23) and the predetermined notification value (for example, the value "1") is transmitted through an FSK-SV signal (Step S24). The value of the instruction command changes every predetermined time (for example, every 3 units of time), and processing of setting to the "IQ swap" state specified by the instruction command is performed as long as the instruction command is received. When the notification value transmitted in Step S24 is successfully received by the transponder 2A, the "IQ swap" states of the transponders 2A and 2B are correctly set at this point. Thus, FSK-SV signals to be subsequently sent include no instruction command to set the "IQ swap" state.

This method allows the phase rotation direction in I/Q modulation to be autonomously adjusted to the right state between the transponders 2A and 2B. Note that the processing flow of FIG. 13 is looped since the flow is repeatedly performed during FSK-SV communication, but may be configured to be terminated upon receipt of the setting complete notification from TRPN A.

<Modified Example of First Embodiment>

Figure 14:
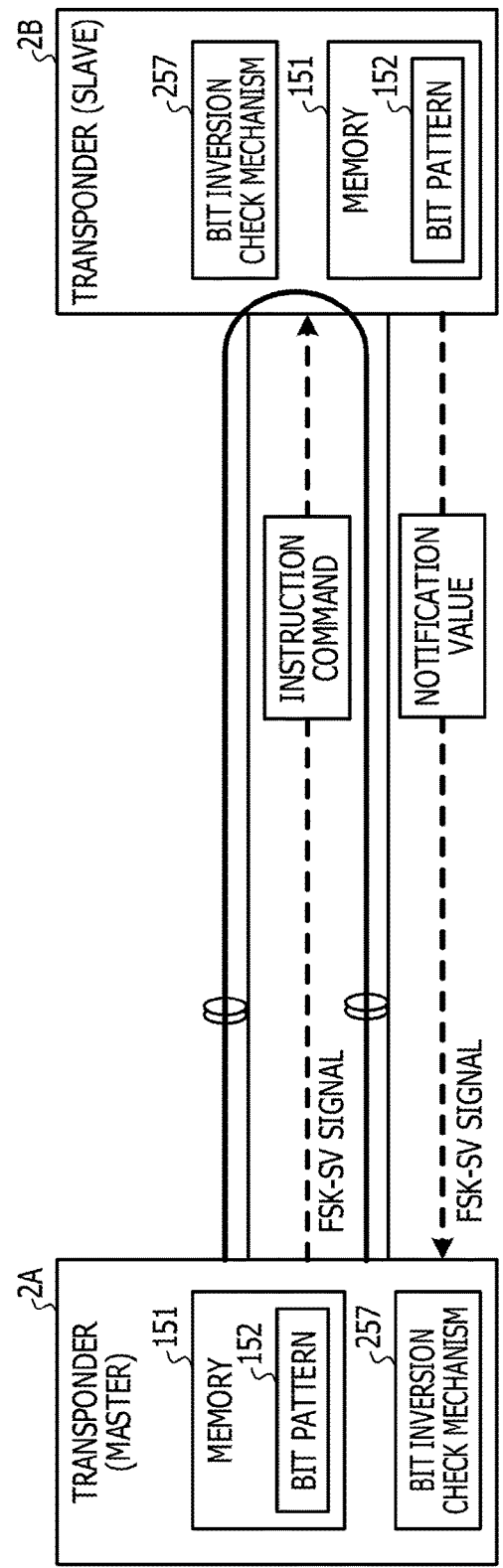
FIG. 14 is a diagram illustrating a modified example of the transmission system according to the first embodiment.

FIG. 14 is a schematic diagram of a transmission system 1A according to a modified example of the first embodiment. In the transmission system 1A, it is determined whether or not FSK-SV signals are offset between polarized waves in two test patterns between a transponder 2A that operates as a master and a transponder 2B that operates as a slave, and bit inversion is performed on the receiving side to obtain the right value. Two "IQ swap" states are set for the transponder 2A and two "IQ swap" states are set to be instructed to the transponder 2B. Thus, 2×2=4 test patterns are used to control the "IQ swap" states of the both transponders to be appropriate states.

The transponders 2A and 2B each include the optical transmitter 10 of FIG. 5 and the optical receiver 20 of FIG. 9, and have the same basic configuration as that of the embodiment described above. In addition, the transponders 2A and 2B each include a predetermined bit pattern 152 stored in a memory 151 and a bit inversion check mechanism 257. The bit pattern 152 is, for example, a pseudo random bit sequence.

Figure 15:
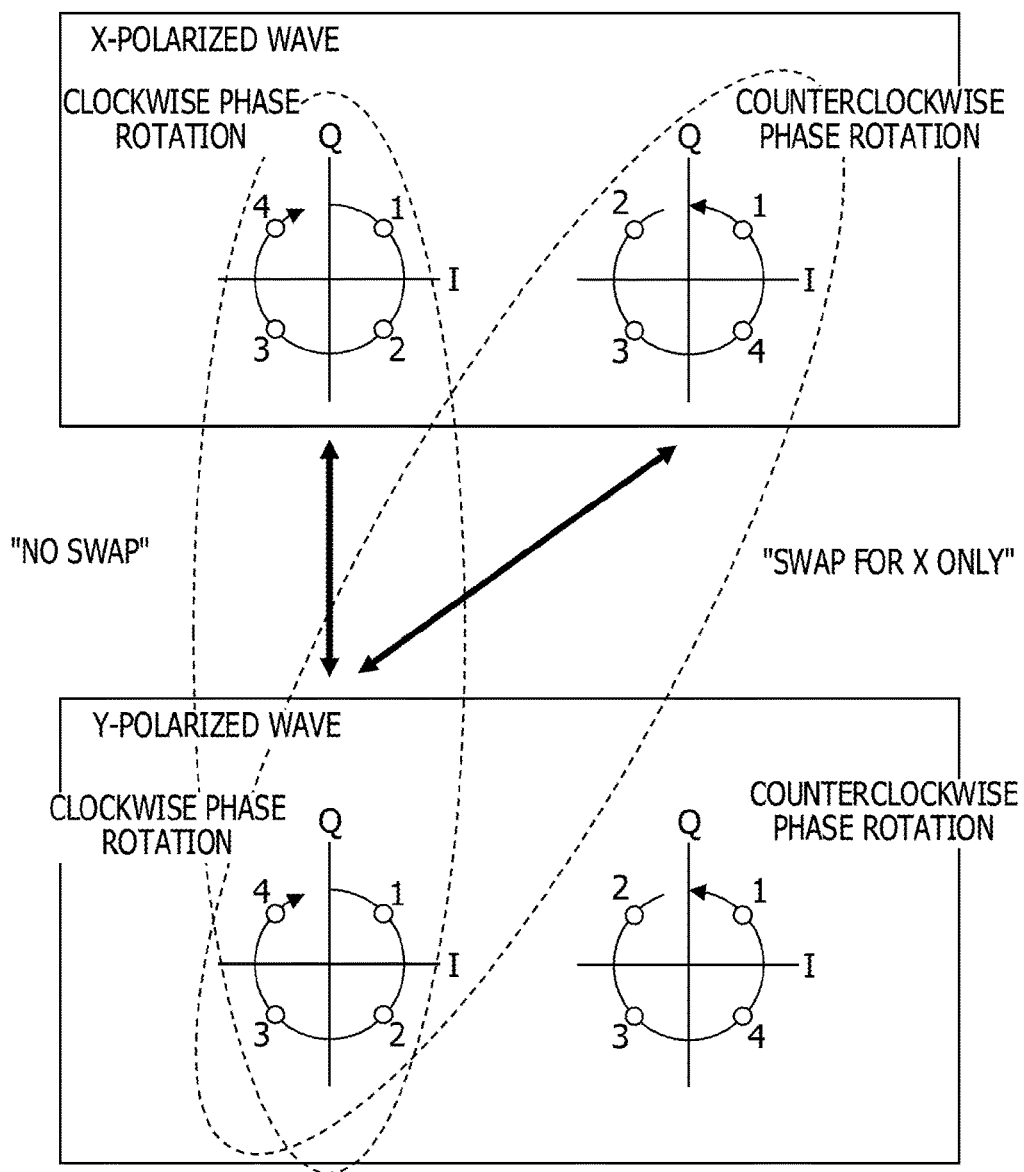
FIG. 15 is a diagram illustrating a reduced trial pattern in the modified example.

FIG. 15 illustrates an example of setting "IQ swap" in two test patterns. For example, "no swap" and "swap for X only" are used as the test patterns for setting the state. When the phase of output light from the I/Q modulator is rotated in the right direction for both of the X-polarized and Y-polarized waves, no signal values are offset and no bit inversion occurs. When the phase rotation direction is reversed for both of the X-polarized and Y-polarized waves, no signal values are offset but bit inversion occurs if the "no swap" state is set in the IQ swap unit 123.

When the phase rotation direction of the output light from the I/Q modulator is reversed for the X-polarized wave, the phase rotation direction for the X-polarized wave is corrected to the right direction by setting "swap for X only" in the IQ swap unit 123. Thus, no values are offset and no bit inversion occurs. When the phase rotation direction of the output light from the I/Q modulator is reversed for the Y-polarized wave, the phase rotation directions for the X-polarized and Y-polarized waves are both reversed by setting "swap for X only" in the IQ swap unit 123. Thus, no values are offset but bit inversion occurs.

Therefore, two test patterns are used to deal with offsetting of the values, and in the event of bit inversion, bit inversion is performed on the receiving side to obtain the right value.

Referring back to FIG. 14, the transponder 2A sets the "IQ swap" state of its own IQ swap unit 123 to "no swap", for example, and transmits an FSK-SV signal together with a predetermined bit pattern by sequentially switching an instruction command to the transponder 2B to "no swap" and "swap for X only". When the actual phase rotation state of the transponder 2A is inverted for either of the X-polarized and Y-polarized waves, setting of "no swap" in the transponder 2A is incorrect, and thus no FSK-SV signal is received by the transponder 2B. The transponder 2A switches its own "IQ swap" state to "swap for X only", and transmits the FSK-SV signal while switching the instruction command between "no swap" and "swap for X only".

Upon successful receipt of the FSK-SV signal, the transponder 2B sets the state of its own IQ swap unit 123 to the state instructed by the instruction command, and transmits a specified value indicating the successful receipt to the transponder 2A together with a predetermined bit pattern. The transponder 2B also checks the received bit pattern against its own bit pattern 152. When the bit patterns do not match, bit inversion is performed by the bit inversion check mechanism 257 and the bit patterns are checked again. If the bit inversion allows the patterns to match, the transponder 2B receives bit patterns by performing bit inversion in subsequent FSK-SV communication.

The transponder 2A receives a predetermined value together with the bit patterns from the transponder 2B, thus recognizing that there is no problem with the "IQ swap" state set in the transponder 2A and the "IQ swap" state set in the transponder 2B. Then, the transponder 2A checks the bit patterns and, when the bit patterns match, receives the FSK-SV signal without bit inversion in subsequent communication. When the bit patterns do not match, the transponder 2A receives the FSK-SV signal by performing bit inversion in subsequent communication.

In the modified example, bit inversion is used to control the "IQ swap" state to be the right state between the opposing transponders 2A and 2B with less test patterns, thereby allowing for transmission and reception of FSK-SV signals while reducing offsetting of FSK signals.

Second Embodiment

Figure 16:
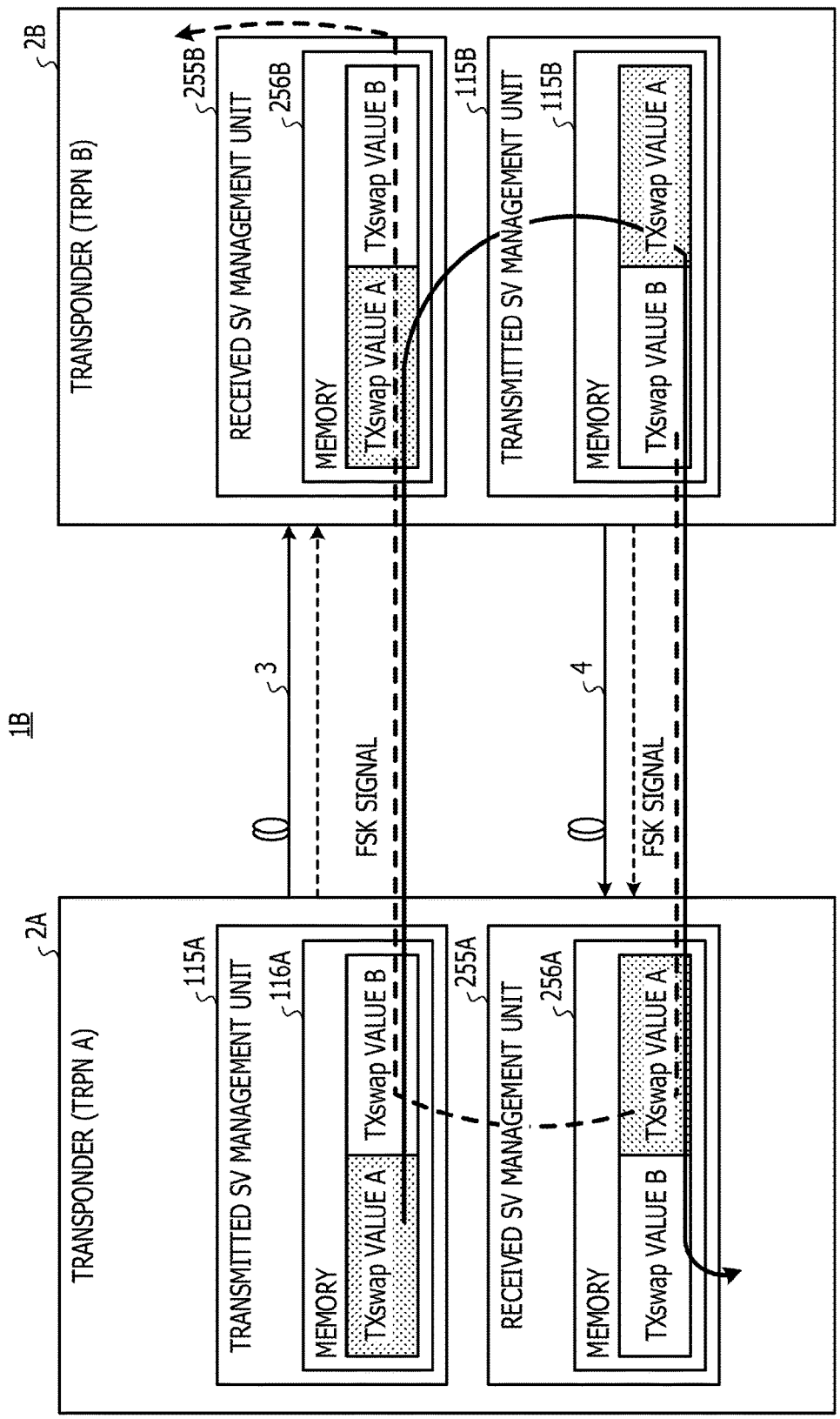
FIG. 16 is a diagram illustrating an operation example between transponders according to a second embodiment.

FIG. 16 is a schematic diagram of a transmission system 1B according to a second embodiment. In the second embodiment, a transponder 2A and a transponder 2B have the same configuration, and use FSK-SV communication to adjust the "IQ swap" state at the same time or within close time frames in both directions.

The transponder 2A includes: a transmitted SV management unit 115A configured to manage an SV signal transmitted by the transponder 2A; and a received SV management unit 255A configured to manage the received SV signal. The transmitted SV management unit 115A manages an "RX swap" value B indicating a reception status of a "TX swap" value A transmitted by the transponder 2A and a "TX swap" value B received from the transponder 2B. The received SV management unit 255A manages an "RX swap" value A indicating a reception status, in the opposing transponder (transponder 2B), of the "TX swap" value B received from the transponder 2B and the "TX swap" value A transmitted by the transponder 2A.

The transmitted SV management unit 115A may be provided in the control processor 11 in the optical transmitter 10 of the transponder 2A (see FIG. 5). The received SV management unit 255A may be provided in the FSK supervisory signal receiving circuit 25 in the optical receiver 20 of the transponder 2A (see FIG. 9) or may be disposed in a processor shared by the optical transmitter 10 and the optical receiver 20. The "TX swap" value A and the "RX swap" value B are stored in a memory region 116A. The memory region 116A may be provided in the control processor 11 or in a memory of the shared processor. The "TX swap" value B and the "RX swap" value A are stored in a memory region 256A. The memory region 256A may be provided in the DSP 24 in the optical receiver 20 or in the memory of the shared processor.

Likewise, the transponder 2B includes: a transmitted SV management unit 115B configured to manage an SV (supervisory control) signal transmitted by the transponder 2B; and a received SV management unit 255B configured to manage the received SV signal. The transmitted SV management unit 115B manages an "RX swap" value A indicating a reception status of a "TX swap" value B transmitted by the transponder 2B and a "TX swap" value A received from the transponder 2A. The received SV management unit 255B manages an "RX swap" value B indicating a reception status, in the opposing transponder (transponder 2A), of the "TX swap" value A received from the transponder 2A and the "TX swap" value B transmitted by the transponder 2B.

The transponders 2A and 2B each automatically adjusts its own "IQ swap" state to the right "IQ swap" state while switching the "IQ swap" state based on whether or not the FSK transmitted from the opposing transponder is successfully received as well as the received information ("TX swap" value and "RX swap" value).

The "TX swap" value includes four values indicating its own "IQ swap" state. The four values are "no swap", "swap for X only", "swap for Y only", and "swap for both X and Y" as in the case of operation example 1.

The "TR swap" value received when the FSK-SV signal is successfully received is written into the "RX swap" value. The "RX swap" value includes five values "no swap", "swap for X only", "swap for Y only", "swap for both X and Y", and "unknown".

As an example, first, the transponder 2A sets the "TX swap" value A to "no swap", sets the "RX swap" value B to "unknown", and outputs an FSK-SV signal to an optical transmission line 3, as indicated by the thick solid lines.

When the FSK-SV signal is received by the transponder 2B, the "TX swap" value A is written into the "TX swap" value A in the received SV management unit 255B of the transponder 2B and also written into the "RX swap" value A in the transmitted SV management unit 115B. Thus, the transponder 2B knows that the right "IQ swap" state of the transponder 2A is "no swap". The "RX swap" value A is transmitted to the transponder 2A through an optical transmission line 4 together with the "TX swap" value of the transponder 2B as the FSK-SV signal.

When the FSK-SV signal is successfully received by the transponder 2A, the "RX swap" value A and the "TX swap" value B are written into the received SV management unit 255A. Thus, the transponder 2A knows the right "IQ swap" state of its own, and the "IQ swap" state is correctly set on a path from the transponder 2A to the transponder 2B.

Likewise, first, the transponder 2B sets the "TX swap" value B to "no swap", sets the "RX swap" value A to "unknown", and outputs an FSK-SV signal to the optical transmission line 4, as indicated by the thick broken lines. When the FSK-SV signal is received by the transponder 2A, the "TX swap" value B is written into the "TX swap" value B in the received SV management unit 255A of the transponder 2A and also written into the "RX swap" value B in the transmitted SV management unit 115A. The value written into the "RX swap" value B is transmitted to the optical transmission line 3 together with the "TX swap" value A as the FSK-SV signal at the next transmission timing. When the FSK-SV signal is successfully received by the transponder 2B, the "RX swap" value B is written into the received SV management unit 255B. At this point, the transponder 2B knows the right "IQ swap" state of its own, and the "IQ swap" state is correctly set on a path from the transponder 2B to the transponder 2A.

FIG. 17 is a flowchart illustrating operations according to the second embodiment. This operation flow is performed by the transponder 2A and the transponder 2B, respectively. For example, description is given focusing on the operations by the transponder 2A. First, the transponder 2A sequentially changes its own "TX swap" value, sets the "RX swap value" to "unknown", and repeatedly transmits FSK-SV signals (Step S31). This state is assumed to be state 0.

Next, if the FSK-SV signal from the transponder 2B is successfully received, the "TX swap" value of the transponder 2B received in this event is written into the "RX swap" value transmitted by the transponder 2A, and transmits an FSK signal (Step S32). At this point, the transponder 2A knows the right "IQ swap" state of the opposing transponder 2B. This state is assumed to be state 1.

Since the right "IQ swap" state of its own is still unknown, the transponder 2A keeps transmitting the FSK-SV signals while sequentially changing its own "TX swap" value (Step S33). When the FSK-SV signal with the "RX swap" value taking a value other than "unknown" is received from the transponder 2B, the "IQ swap" state of its own is set to the "RX swap" value and the "RX swap" value of the transmitted SV management unit 115A is fixed to that value (Step S34). At this point, the transponder 2A knows its own "IQ swap" state. This state is assumed to be state 2.

Next, it is determined whether or not the "TX swap" value and "RX swap" value managed by the received SV management unit 255A no longer change (Step S35). Steps S33 to S35 are repeated until the "TX swap" value and the "RX swap" value no longer change. When the "TX swap" value and the "RX swap" value no longer change, the transponder 2A knows that the right "IQ swap" state is set in both directions (YES in Step S35), and then terminates the processing.

FIG. 18 is a diagram explaining a state transition of the transponder 2A (or 2B). The transponders are hereinafter collectively called the "transponder 2".

The state 0 is a state where neither the right "IQ swap" state of the own transponder nor the right "IQ swap" state of the opposing transponder is known. A condition for transition to the state 0 is setting of an initial state. The transponder 2 transmits an FSK-SV signal while switching its own "IQ swap" state. As for the value of the SV signal to be transmitted, the "TX swap" value is sequentially switched, and the "RX swap" value is set to a value indicating "unknown".

The state 1 is a state where the right "IQ swap" state of the own transponder is unknown but the right "IQ swap" state of the opposing transponder is known. A condition for transition to the state 1 is successful receipt of the FSK-SV signal. In this case, the transponder 2 writes the "TX swap" value received from the opposing transponder into its own "RX swap" value. As for the value of the SV signal to be transmitted, the "TX swap" value is sequentially switched, and the "RX swap" value is fixed to the received "TX swap" value of the opposing transponder.

The state 2 is a state where the right "IQ swap" state of the own transponder and the right "IQ swap" state of the opposing transponder are known. A condition for transition to the state 2 is that the FSK-SV signal is successfully received and the received "RX swap" value has a value other than "unknown". In this case, the transponder 2 writes the "TX swap" value received from the opposing transponder into the received "RX swap" value indicating its own "IQ swap" state. As for the value of the SV signal to be transmitted, the "TX swap" value is fixed to the received "RX swap" value, and the "RX swap" value is fixed to the previously set "TX swap" value of the opposing transponder.

The state 3 is a state where the transponder 2 recognizes its own right "IQ swap" state and the right "IQ swap" state of the opposing transponder, and recognizes that the opposing transponder also knows the right "IQ swap" states of the both transponders. A condition for transition to the state 3 is that the FSK-SV signal is continuously successfully received and the "RX swap" has a value other than "unknown". In this case, the transponder 2 finishes the "IQ swap" determination processing.

<Operation Example 1 of Second Embodiment>

FIG. 19 is a diagram illustrating operation example 1 of the second embodiment. In operation example 1, the transponder 2A (described as "TRPN A") and the transponder 2B (described as "TRPN B") set the "IQ swap" state at the same time. In the transponder 2A, the phase rotation direction is reversed for both of the X-polarized and Y-polarized waves, and the right "IQ swap" state to be set in the IQ swap unit 123 is "swap for both X and Y". In the transponder 2B, the phase rotation direction is reversed for the Y-polarized wave only, and the right "IQ swap" state to be set in the IQ swap unit 123 is "swap for Y only". It is assumed that a transmission delay time is 6 units of time.

The transponder 2A is in the state 0 from time t=0 to t=7. In the state 0, the "RX swap" value of the transmitted SV signal is set to "unknown", and the FSK-SV signal is transmitted by sequentially changing the "TX swap" value. Due to the transmission delay time, the FSK-SV signal from the transponder 2B does not reach the transponder 2A until t=5. At t=6 and t=7, the transponder 2A may not receive the FSK-SV signal since the "IQ swap" state set in the transponder 2B is not the right state.

At t=8, the "TX swap" value from the transponder 2B is received, and a transition is made to the state 1. The value included in the received "TX swap" value is "swap for Y only" (abbreviated as "Y" in FIG. 19), and this value is written into the "RX swap" value of the transmitted SV signal. Thereafter, the "RX swap" value of the transmitted SV signal is fixed to "Y". On the other hand, the "TX swap" value of the transmitted SV signal is sequentially switched until a state transition trigger occurs, and the FSK-SV signal is transmitted.

At t=16, the transponder 2A receives the "RX swap" value taking a value other than "unknown" in the received SV signal for the first time, and then shifts to the state 2. More specifically, the transponder 2A recognizes that its own right "IQ swap" state is "swap for both X and Y" (abbreviated as "XY" in FIG. 19) and the right "IQ swap" value of the transponder 2B is "Y". Thereafter, the "TX swap" value of the transmitted SV signal is fixed to "XY".

At and after t=23, the FSK-SV signal from the transponder 2B is continuously successfully received, and a transition is made to the state 3. The transponder 2A recognizes that the "RX swap" value of the received SV signal is "XY" indicating its own right "IQ swap" state and that the "TX swap" value is "Y" indicating the right "IQ swap" state of the transponder 2B. In other words, the transponder 2A knows that the completion of setting the right "IQ swap" states of the both transponders is also recognized by the transponder 2B.

Meanwhile, at t=9, the transponder 2B successfully receives the FSK-SV signal from the transponder 2A for the first time, and then shifts to the state 1. The transponder 2B recognizes from the "TX swap" value included in the received SV signal that the right "IQ swap" state of the transponder 2A is "XY", and writes this value into the "RX swap" value of the transmitted SV signal. Thereafter, the "RX swap" value of the transmitted SV signal of the transponder 2B is fixed to "XY". On the other hand, the "TX swap" value of the transmitted SV is sequentially switched until t=17, and the FSK-SV signal is transmitted.

At t=17, the transponder 2B receives the "RX swap" value taking a value other than "unknown" for the first time, and then shifts to the state 2. Thus, the transponder 2B knows that its own right "IQ swap" state is "swap for Y only" (abbreviated as "Y" in FIG. 19), and thereafter fixes the "TX swap" value of the transmitted SV signal to "Y".

At and after t=21, the FSK-SV signal from the transponder 2A is continuously successfully received, and a transition is made to the state 3. The transponder 2B recognizes that the "IQ swap" value is correctly set in the both transponders, and terminates the "IQ swap" state determination processing.

This operation allows setting of the right "IQ swap" to be completed approximately at the same time or within close time frames between the transponders 2A and 2B.

FIG. 20 illustrates an operation flow between the transponders 2A and 2B in FIG. 19. From time t=0, TRPN A (transponder 2A) and TRPN B (transponder 2B) start transmission while switching their own "IQ swap" states (Step S41). The state in this step is the state 0.

After the elapse of a predetermined time (for example, at t=8), TRPN A successfully receives the FSK-SV signal for the first time, and knows the right "IQ swap" state of TRPN B. Then, TRPN A writes the "TX swap" value of the received SV signal from TRPN B into the "RX swap" value of the transmitted SV signal of its own, and notifies a correct answer (Step S42). The state so far is the state 1.

At t=17, for example, TRPN B receives the FSK-SV signal in which the "RX swap" value included in the received SV signal from TRPN A is the value other than "unknown" for the first time, and knows that the correct answer for its own "IQ swap" state is "swap for Y only". TRPN B fixes its own "IQ swap" state to "Y", and at the same time, fixes the "TX swap" value of the transmitted SV to "Y" (Step S43). The state so far is the state 2.

TRPN A confirms at and after t=23 and TRPN B confirms at and after t=21 that the "TX swap" value and "RX swap" value in the received SV signal do not change, and then terminate the determination processing (Step S44). This state is the state 3.

In operation example 1, the right "IQ swap" state may be set approximately at the same time between the opposing transponders.

<Operation Example 2 of Second Embodiment>

FIG. 21 illustrates operation example 2 of the second embodiment. In operation example 2, an operation of controlling the "IQ swap" state is sequentially started between the transponders 2A and 2B. From t=0, the transponder 2B transmits the FSK-SV signal while switching its own "IQ swap" state.

The transponder 2A receives the FSK-SV signal for the first time at t=8, recognizes that the right "IQ swap" state of the transponder 2B is "Y", and then shifts to the state 1. The transponder 2A writes the "TX swap" value included in the received SV signal into the "RX swap" value of the transmitted SV of its own. The transponder 2A fixes the "RX swap" value of the transmitted SV to "Y" and transmits the FSK-SV signal by sequentially switching its own "IQ swap" state.

At t=17, the transponder 2B receives the FSK signal from the transponder 2A for the first time, and knows from the "TX swap" value included in the received SV that the right "IQ swap" state of the transponder 2A is "XY". At the same time, the transponder 2B knows that its own right "IQ swap" state is "Y" since the "RX swap" value included in the received SV is other than "unknown". At this point, the transponder 2B shifts to the state 2. Since the transponder 2B recognizes the right states of its own and of the opposing transponder 2A at the same time, a transition is made from the state 0 to the state 2. Thereafter, the transponder 2B keeps transmitting the FSK-SV signals by fixing the "TX swap" value of the transmitted SV signal to "Y" and fixing the "RX swap" value to "XY".

At t=23, the transponder 2A receives the FSK-SV signal having the "RX swap" value other than "unknown". The transponder 2A recognizes its own right "IQ swap" state, fixes the "IQ swap" state to "XY", and writes this value into the "TX swap" value of the transmitted SV signal. Since the transponder 2A continuously receives the FSK signals at and after t=23, the transponder 2A shifts from the state 1 to the state 3 at t=23.

Meanwhile, the transponder 2B continuously receives the FSK-SV signals at and after t=29 after the transmission delay of 6 units of time, and terminates the "IQ swap" state determination processing.

In operation example 2, the transponders 2A and 2B do not have to start transmitting the FSK-SV signals at the same time. Therefore, either one of the transponders starts the "IQ swap" state control operation using the FSK-SV signal, and a collaborative operation is performed upon receipt of the FSK-SV signal by the opposing transponder. This method also allows the phase rotation direction of the optical signal outputted from the I/Q modulator to be correctly maintained by autonomously controlling the right "IQ swap" state in both directions without using the DSN controller.

Figure 22:
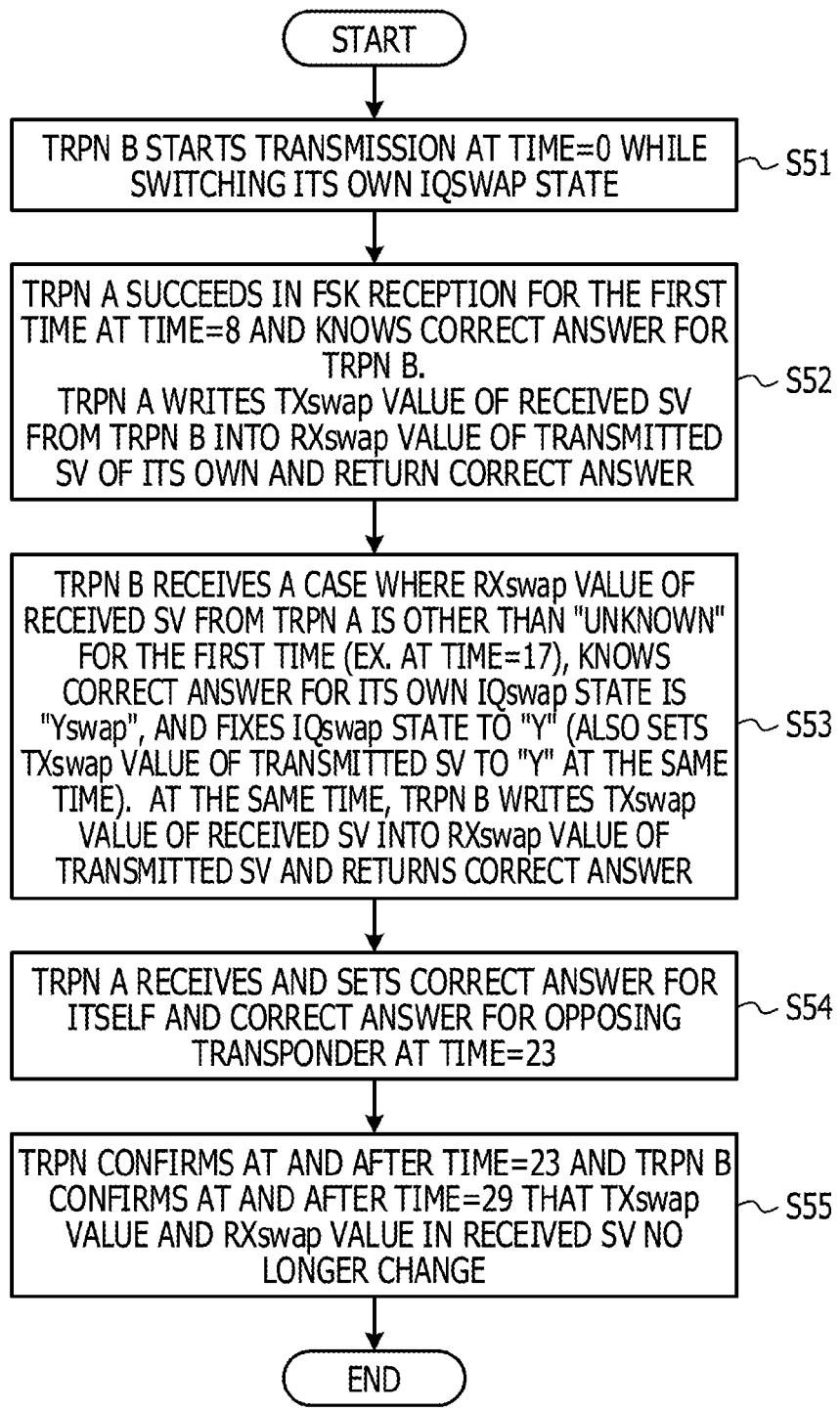
FIG. 22 is a flowchart during the operation of FIG. 21.

FIG. 22 is a flowchart illustrating the operations of FIG. 21. At t=0, TRPN B transmits the FSK-SV signal while switching its own "IQ swap" state (Step S51).

TRPN A receives the FSK-SV signal for the first time at t=8, and recognizes that the right "IQ swap" state of TRPN B is "Y". TRPN A writes the "TX swap" value included in the received SV signal into the "RX swap" value of the transmitted SV of its own, and transmits the FSK-SV signal while sequentially switching its own "IQ swap" state (Step S52).

TRPN B receives the FSK signal from TRPN A for the first time at t=17, and knows the right "IQ swap" state of the TRPN A and its own right "IQ swap" state at the same time since the "RX swap" value included in the received SV is other than "unknown" (Step S53). TRPN B fixes its own "IQ swap" state to "Y", and sets the "TX swap" value of the transmitted SV signal of its own to "Y". At the same time, TRPN B writes the received "TX swap" value into the "RX swap" value of the transmitted SV signal, and transmits the FSK-SV signal (Step S53).

At t=23, TRPN A recognizes its own right "IQ swap" state from the "RX swap" value of the received SV signal, fixes the "IQ swap" state to "XY", and writes this value into the "TX swap" value of the transmitted SV signal (Step S54).

TRPN A confirms at and after t=23 and TRPN B confirms at and after t=29 that the "TX swap" value and "RX swap" value in the received SV signal no longer change, and then terminate the processing (Step S55).

In operation example 2, although a time difference occurs in setting of the right "IQ swap" state for the transmission delay time between the opposing transponders, the transponders do not have to start the control processing at the same time, resulting in a simpler control operation.

Although the disclosure has been described above based on the specific embodiments, the disclosure is not limited to the above embodiments. The "IQ swap" control described above is also applicable to correction of the phase rotation direction of optical signals when pre-equalization is performed by the DSP on the transmission side. Moreover, the "IQ swap" control for controlling the phase rotation state of the output light from the I/Q modulator is not limited to swapping of the I/Q channels or sign inversion by the DSP. For example, a configuration may be adopted in which signal paths to the drivers 16-1 and 16-2 and/or signal paths to the drivers 16-3 and 16-4 are switched using switches, transistors or the like.

The specified value to be returned when the transponder 2B successfully receives the instruction command in the master-slave method is not limited to the value "1" or "0", but another receipt notification may be performed. Thus, the problems of bit inversion and value offset between the opposing transponders are solved to improve the quality of automatic control using the FSK-SV signals.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission system comprising:
   a first transponder including a first in-phase/quadrature (I/Q) modulator; and
   a second transponder including a second I/Q modulator, and configured to communicate with the first transponder using a frequency modulation scheme, wherein the first transponder is configured to:
   set a first phase rotation mode in a first state for first light signal output from the first I/Q modulator; and
   transmit, to the second transponder, a first command to specify a second phase rotation mode for second light signal output from the second I/Q modulator, the second transponder is configured to:
   set, in response to the first command, the second phase rotation mode in a state specified by the first command; and
   transmit, to the first transponder, a first notification indicating reception of the first command, and
   the first transponder is further configured to:
   establish the first phase rotation mode in the first state in response to the first notification; and
   when the first notification does not reach the first transponder within a predetermined time period after the transmitting of the first command, set the first phase rotation mode in a second state different from the first state, and transmit, to the second transponder, a second command to specify the second phase rotation mode for the second light signal output from the second I/O modulator.

2. The transmission system according to claim 1, wherein the second transponder is configured to:
set, in response to the second command, the second phase rotation mode in a state specified by the second command; and
transmit, to the first transponder, a second notification indicating reception of the second command, and
the first transponder is configured to fix, in response to the second notification, the first phase rotation mode in the second state.

3. The transmission system according to claim 2, wherein the first transponder is configured not to execute further command transmission in response to the first notification or the second notification, and
the second transponder is configured to fix the second phase rotation mode in response to the first command or the second command.

4. The transmission system according to claim 1, wherein the first transponder is configured to transmit a first bit pattern, and
the second transponder is configured to invert bits in a second bit pattern received after reception of the first bit pattern when bit inversion is detected in the first bit pattern.

5. The transmission system according to claim 4, wherein the second transponder is configured to transmit the first bit pattern, and
the first transponder is configured to invert the bits in the second bit pattern received after the reception of the first bit pattern when the bit inversion is detected in the first bit pattern.

6. The transmission system according to claim 1, wherein the first transponder is configured to change the first phase rotation mode between a first pattern for setting the same phase rotation direction for X-polarized and Y-polarized waves of the first light signal output from the first I/Q modulator and a second pattern for reversing the phase rotation direction of one of the X-polarized wave and the Y-polarized wave.

7. The transmission system according to claim 6, wherein the first transponder is configured to swap in-phase channel and quadrature channel signals inputted to the first I/Q modulator, or switch the first phase rotation mode by inverting a sign of one of the in-phase channel and the quadrature channel.

8. The transmission system according to claim 6, wherein the first transponder is configured to transmit the first command to instruct switching of the second phase rotation mode between a first setting for setting the same phase rotation direction for X-polarized and Y-polarized waves of the second light signal output from the second I/Q modulator and a second setting for reversing the phase rotation direction of one of the X-polarized wave and the Y-polarized wave.

9. The transmission system according to claim 1, wherein when the first command is received by the second transponder and bit inversion is detected in a third bit pattern transmitted with the first command, the second transponder is configured to invert the bits in a fourth bit pattern received after reception of the third bit pattern.

10. A transmission system comprising:
a first transponder including a first in-phase/quadrature (I/Q) modulator; and a second transponder including a second I/Q modulator, and configured to communicate with the first transponder using a frequency modulation scheme, wherein the first transponder is configured to:
set a first phase rotation mode in a first state for first light signal output from the first I/Q modulator; and
transmit, to the second transponder, a first information indicating the first state, and
the second transponder is configured to:
set a second phase rotation mode in a second state for second light signal output from the second I/Q modulator; and
transmit, to the first transponder, a second information indicating the second state, and
when the second transponder receives the first information, transmit, to the first transponder, the received first information with the second information.

11. The transmission system according to claim 10, wherein
the first transponder is configured to fix the first phase rotation mode in the first state when the first transponder receives the first information from the second transponder.

12. The transmission system according to claim 10, wherein
when the first transponder receives the second information, the first transponder is configured to transmit, to the second transponder, the received second information with the first information, and
the second transponder is configured to fix the second phase rotation mode in the second state when the second transponder receives the second information from the first transponder.

13. A method using a first transponder including a first in-phase/quadrature (I/O) modulator and a second transponder including a second I/O modulator, the first transponder configured to communicate with the second transponder using a frequency modulation scheme, the method comprising:
setting, by the first transponder, a first phase rotation mode in a first state for first light signal output from the first I/O modulator;
transmitting, from the first transponder to the second transponder, a first command to specify a second phase rotation mode for second light signal output from the second I/O modulator;
setting, by the second transponder in response to the first command, the second phase rotation mode in a state specified by the first command; and
transmitting, from the second transponder to the first transponder, a first notification indicating reception of the first command;
establishing, by the first transponder, the first phase rotation mode in the first state in response to the first notification; and
when the first notification does not reach the first transponder within a predetermined time period after the transmitting of the first command, setting the first phase rotation mode in a second state different from the first state, and transmitting, to the second transponder, a second command to specify the second phase rotation mode for the second light signal output from the second I/O modulator.

14. The method according to claim 13, further comprising:
setting, by the second transponder in response to the second command, the second phase rotation mode in a state specified by the second command;
transmit, from the second transponder to the first transponder, a second notification indicating reception of the second command; and fixing, by the first transponder in response to the second notification, the first phase rotation mode in the second state.

15. The method according to claim 14, further comprising:
   not executing, by the first transponder, further command transmission in response to the first notification or the second notification; and
   fixing, by the second transponder, the second phase rotation mode in response to the first command or the second command.

16. The method according to claim 13, further comprising:
   transmitting, by the first transponder, a first bit pattern; and
   inverting, by the second transponder, bits in a second bit pattern received after reception of the first bit pattern when bit inversion is detected in the first bit pattern.

* * * * *